United States Patent
Park et al.

(10) Patent No.: US 8,790,967 B2
(45) Date of Patent: Jul. 29, 2014

(54) METHOD OF FABRICATING POLYCRYSTALLINE SILICON LAYER, TFT FABRICATED USING THE SAME, METHOD OF FABRICATING TFT, AND ORGANIC LIGHT EMITTING DIODE DISPLAY DEVICE HAVING THE SAME

(75) Inventors: Byoung-Keon Park, Suwon-si (KR); Jin-Wook Seo, Suwon-si (KR); Tae-Hoon Yang, Suwon-si (KR); Kil-Won Lee, Suwon-si (KR); Ki-Yong Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/464,579

(22) Filed: May 4, 2012

(65) Prior Publication Data

US 2012/0220084 A1    Aug. 30, 2012

Related U.S. Application Data

(62) Division of application No. 12/130,340, filed on May 30, 2008, now abandoned.

(30) Foreign Application Priority Data

May 31, 2007  (KR) .................. 10-2007-0053314

(51) Int. Cl.
H01L 21/335  (2006.01)
(52) U.S. Cl.
USPC .......................................................... 438/143
(58) Field of Classification Search
USPC .......................................................... 438/143
See application file for complete search history.

(56) References Cited

U.S. PATENT DOCUMENTS

| | | | |
|---|---|---|---|
| 3,465,209 | A | 9/1969 | Denning et al. |
| 5,637,515 | A | 6/1997 | Takemura |

(Continued)

FOREIGN PATENT DOCUMENTS

| | | |
|---|---|---|
| CN | 1388591 | 1/2003 |
| CN | 1638147 | 7/2005 |

(Continued)

OTHER PUBLICATIONS

Final Office Action of U.S. Appl. No. 12/130,340 dated Mar. 8, 2012.

(Continued)

*Primary Examiner* — Jae Lee
(74) *Attorney, Agent, or Firm* — H.C. Park & Associates, PLC

(57) ABSTRACT

A method of fabricating a polycrystalline silicon layer includes: forming an amorphous silicon layer on a substrate; crystallizing the amorphous silicon layer into a polycrystalline silicon layer using a crystallization-inducing metal; forming a metal layer pattern or metal silicide layer pattern in contact with an upper or lower region of the polycrystalline silicon layer corresponding to a region excluding a channel region in the polycrystalline silicon layer; and annealing the substrate to getter the crystallization-inducing metal existing in the channel region of the polycrystalline silicon layer to the region in the polycrystalline silicon layer having the metal layer pattern or metal silicide layer pattern. Accordingly, the crystallization-inducing metal existing in the channel region of the polycrystalline silicon layer can be effectively removed, and thus a thin film transistor having an improved leakage current characteristic and an OLED display device including the same can be fabricated.

24 Claims, 13 Drawing Sheets

(56) References Cited

U.S. PATENT DOCUMENTS

| | | | |
|---|---|---|---|
| 6,087,206 A | 7/2000 | Hamada | |
| 6,191,449 B1 | 2/2001 | Shino | |
| 6,380,007 B1 | 4/2002 | Koyama | |
| 6,399,460 B1 | 6/2002 | Yamaguchi et al. | |
| 6,495,857 B2 | 12/2002 | Yamazaki | |
| 6,500,704 B1 | 12/2002 | Hirano et al. | |
| 6,506,669 B1 | 1/2003 | Kuramasu et al. | |
| 6,531,815 B1 | 3/2003 | Okuyama et al. | |
| 6,620,661 B2 | 9/2003 | Maekawa et al. | |
| 6,746,905 B1 | 6/2004 | Fukuda | |
| 6,893,503 B1 | 5/2005 | Ohnuma et al. | |
| 7,045,444 B2 | 5/2006 | Yamazaki et al. | |
| 7,098,089 B2 | 8/2006 | Paik | |
| 7,130,002 B2 | 10/2006 | Seo et al. | |
| 7,202,143 B1 | 4/2007 | Naseem et al. | |
| 2001/0025992 A1 | 10/2001 | Nakajima et al. | |
| 2001/0041397 A1 | 11/2001 | Fukushima | |
| 2002/0013114 A1 | 1/2002 | Ohtani | |
| 2002/0016029 A1 | 2/2002 | Kawakita et al. | |
| 2002/0074548 A1 | 6/2002 | Lee et al. | |
| 2002/0096681 A1 | 7/2002 | Yamazaki et al. | |
| 2002/0182828 A1 | 12/2002 | Asami et al. | |
| 2003/0013279 A1 | 1/2003 | Jang et al. | |
| 2003/0030108 A1 | 2/2003 | Morosawa | |
| 2003/0148561 A1 | 8/2003 | Nakajima | |
| 2003/0155572 A1 | 8/2003 | Han et al. | |
| 2003/0201442 A1 | 10/2003 | Makita | |
| 2004/0046171 A1 | 3/2004 | Lee et al. | |
| 2004/0089878 A1 | 5/2004 | Takehashi et al. | |
| 2004/0135180 A1 | 7/2004 | Makita | |
| 2004/0164300 A1 | 8/2004 | Yamazaki et al. | |
| 2004/0206958 A1 | 10/2004 | Yamazaki et al. | |
| 2005/0035352 A1 | 2/2005 | Onizuka | |
| 2005/0105037 A1 | 5/2005 | Kim et al. | |
| 2005/0110022 A1 | 5/2005 | Kim et al. | |
| 2005/0133867 A1 | 6/2005 | Ohtani et al. | |
| 2005/0140841 A1 | 6/2005 | Yang et al. | |
| 2005/0170573 A1 | 8/2005 | Makita et al. | |
| 2005/0285111 A1 | 12/2005 | Tsuboi | |
| 2006/0033107 A1 | 2/2006 | Lee et al. | |
| 2006/0040438 A1 | 2/2006 | Lu et al. | |
| 2006/0115948 A1 | 6/2006 | Tokunaga | |
| 2006/0263957 A1 | 11/2006 | Wong et al. | |
| 2007/0007529 A1 | 1/2007 | Takemura et al. | |
| 2007/0096207 A1* | 5/2007 | Makita | 257/347 |
| 2007/0181890 A1 | 8/2007 | Yamazaki et al. | |
| 2007/0207577 A1* | 9/2007 | Oyu | 438/227 |
| 2007/0228420 A1 | 10/2007 | Takano et al. | |
| 2008/0001228 A1 | 1/2008 | Shionoiri et al. | |
| 2008/0217620 A1 | 9/2008 | Park et al. | |
| 2008/0246027 A1 | 10/2008 | Kim | |
| 2008/0296565 A1 | 12/2008 | Park et al. | |
| 2009/0008642 A1 | 1/2009 | Kim et al. | |
| 2009/0050893 A1 | 2/2009 | Park | |
| 2009/0050894 A1 | 2/2009 | Park et al. | |
| 2009/0242895 A1 | 10/2009 | Park et al. | |
| 2009/0256469 A1 | 10/2009 | Park et al. | |
| 2010/0006855 A1 | 1/2010 | Park et al. | |

FOREIGN PATENT DOCUMENTS

| | | |
|---|---|---|
| EP | 025821 | 6/1987 |
| EP | 0816903 | 1/1998 |
| EP | 1052700 | 11/2000 |
| EP | 1508921 | 2/2005 |
| EP | 1524702 | 4/2005 |
| EP | 1858068 | 11/2007 |
| EP | 2003695 | 12/2008 |
| EP | 2009680 | 12/2008 |
| EP | 2028687 | 2/2009 |
| EP | 2107613 | 10/2009 |
| JP | 62-104173 | 5/1987 |
| JP | 05-047791 | 2/1993 |
| JP | 06-151859 | 5/1994 |
| JP | 07-176753 | 7/1995 |
| JP | 07-326764 | 12/1995 |
| JP | 08-255907 | 10/1996 |
| JP | 10-012882 | 1/1998 |
| JP | 10-223533 | 8/1998 |
| JP | 10-242477 | 9/1998 |
| JP | 11-008393 | 1/1999 |
| JP | 11-111992 | 4/1999 |
| JP | 11-261075 | 9/1999 |
| JP | 2000-036598 | 2/2000 |
| JP | 2000-11-4527 | 4/2000 |
| JP | 2000-252474 | 9/2000 |
| JP | 2001-077364 | 3/2001 |
| JP | 2001-319878 | 11/2001 |
| JP | 2002-093745 | 3/2002 |
| JP | 2003-007719 | 1/2003 |
| JP | 2003-075870 | 3/2003 |
| JP | 2003-100633 | 4/2003 |
| JP | 2003-188098 | 4/2003 |
| JP | 2003-203924 | 7/2003 |
| JP | 2003-298059 | 10/2003 |
| JP | 2003-303831 | 10/2003 |
| JP | 2003-318194 | 11/2003 |
| JP | 2004-022845 | 1/2004 |
| JP | 2005-123565 | 5/2005 |
| JP | 2005-181973 | 7/2005 |
| JP | 2005-197526 | 7/2005 |
| JP | 2006-049823 | 2/2006 |
| JP | 2006-066860 | 3/2006 |
| JP | 2006-345003 | 12/2006 |
| JP | 2007-251149 | 9/2007 |
| KR | 10-1999-0075412 | 10/1999 |
| KR | 10-1999-0088504 | 12/1999 |
| KR | 10-2000-0041547 | 7/2000 |
| KR | 10-2000-0052006 | 8/2000 |
| KR | 10-2003-0003043 | 1/2003 |
| KR | 10-2003-0057656 | 7/2003 |
| KR | 10-2003-0069779 | 8/2003 |
| KR | 10-2003-0073075 | 9/2003 |
| KR | 10-2003-0073076 | 9/2003 |
| KR | 10-2003-0084738 | 11/2003 |
| KR | 10-2004-0082168 | 9/2004 |
| KR | 10-2005-0036625 | 4/2005 |
| KR | 10-2005-0041836 | 4/2005 |
| KR | 10-0482462 | 4/2005 |
| KR | 10-2005-0049684 | 5/2005 |
| KR | 10-2005-0049692 | 5/2005 |
| KR | 10-0509529 | 8/2005 |
| KR | 10-2005-0106244 | 9/2005 |
| KR | 10-2006-0099694 | 9/2006 |
| KR | 10-2007-0024016 | 3/2007 |
| KR | 10-2008-0082827 | 9/2008 |

OTHER PUBLICATIONS

Final Office Action of U.S. Appl. No. 12/502,413, dated Feb. 16, 2012.

Non-Final Office Action of U.S. Appl. No. 12/194,739 dated on Jan. 20, 2012.

Notice of Allowance issued on Oct. 4, 2011 in co-pending U.S. Appl. No. 12/194,730.

Notice of Allowance issued on Oct. 17, 2011 in co-pending U.S. Appl. No. 12/409,085.

Non-Final Office Action issue on Oct. 7, 2011 in co-pending U.S. Appl. No. 12/130,340.

Non-Final Office Action issued on Sep. 30, 2011 in co-pending U.S. Appl. No. 12/502,413.

Non-Final Office Action issued on Sep. 21, 2011 in co-pending U.S. Appl. No. 12/405,466.

Jones, et al., "Diffusivity of impurities in polysilicon," Feb. 21, 2007, XP009150765.

Non-Final Office Action dated Jun. 24, 2011 in U.S. Appl. No. 12/409,085.

Final Office Action of U.S. Appl. No. 12/194,739 issued on Jun. 9, 2011.

Final Office Action of U.S. Appl. No. 12/194,730 issued on May 4, 2011.

(56) References Cited

OTHER PUBLICATIONS

Final Office Action of U.S. Appl. No. 12/130,340 issued on May 12, 2011.
US Office Action dated Dec. 9, 20120, issued in corresponding U.S. Appl. No. 12/194,730.
US Office Action dated Dec. 23, 20120, issued in corresponding U.S. Appl. No. 12/194,739.
Notice of Allowance issued for related U.S. Appl. No. 13/333,587 dated Jan. 15, 2013.
Notice of Allowance issued for related U.S. Appl. No. 12/405,466 dated Aug. 8, 2012.
Final Office Action of U.S. Appl. No. 12/194,739 dated Jul. 6, 2012.
Notice of Allowance issued for related U.S. Appl. No. 12/194,730 dated Jun. 12, 2012.
US Office Action dated Nov. 26, 2010, issued in corresponding U.S. Appl. No. 12/130,340.
U.S. Office Action dated Mar. 8, 2010, issued in U.S. Appl. No. 12/194,739.
European Search Report issued Nov. 3, 2009 in corresponding European Patent Application No. 09165373.3.
Fariborz Assaderaghi et al.: "Dynamic Threshold-Voltage Mosfet (DTMOS) for Ultra-Low Voltage VLSI," IEEE Transactions on Electron Devices, IEEE Service Center, Piscataway, NJ, US, vol. 44, No. 3, Mar. 1, 1997, XP011016082.
Office Action issued Aug. 28, 2009, in corresponding Chinese Patent Application No. 200810214019.
European Search Report issued Sep. 2, 2009, in corresponding European Application No. 09156279.3.
European Partial Search Report issued Sep. 4, 2009, in corresponding European Application No. 09157829.4.
Ishikawa et al., "The Diffusion of Bismuth in Silicon," Japanese Journal of Applied Physics; vol. 28, No. 7, pp. 1272-1273; 1989; XP009121147.
European Office Action issued on Aug. 11, 2009 in corresponding European Patent Application No. 08157161.
Hu, Chen-Ming, et al., "Getting of Nickel within Ni-Metal Induced Lateral Crystallization Plycrystalline Silicon Film through the Contact Holes," Japanese Journal of Applied Physics, vol. 46, No. 48, 2007, pp. L1188-L1190.
Ng, K. K., Complete Guide to Semiconductor Devices, Second Edition, Wiley, New York, 2002, pp. 694-695.
European Search Report issued on Dec. 11, 2008 in corresponding European Application No. 08162758.0-1528.
Korean Notice of Allowability issued on Dec. 26, 2008 in corresponding Korean Application No. 2007-84934.
Korean Notice of Allowability issued on Dec. 26, 2008 in corresponding Korean Application No. 2007-84412.
Search Report issued by European Patent Office in European Patent Application No. 08157167.1 on Nov. 28, 2008.
Notice of Allowability issued on Sep. 29, 2008 in corresponding Korean Patent Application No. 2007-53314.
Office Action issued by Korean Intellectual Property Office in Korean Patent Application No. 2007-53314 on Mar. 25, 2008.
S.M. Myers, Seibt, M. & Schröter, W., "Mechanisms of Transition-metal Gettering in Silicon," Journal of Applied Physics, V. 88, N.7 (Oct. 1, 2000), pp. 3795-3819.
J.L. Benton, Jacobson, D.C., Jackson, B., Johnson, J.A., Boone, T., Eagleshan, D.J., Stevie, F.A., & Becerro, J, "Behavior of Molybdenum in Silicon Evaluated for Integrated Circuit Processing," Journal of the Electrochemical Society, 146 (5) (1999), pp. 1929-1933.
Final Office Action of U.S. Appl. No. 12/405,466 dated Apr. 5, 2012.
Notice of Allowance in U.S. Appl. No. 12/194,739 dated Apr. 2, 2013.

\* cited by examiner

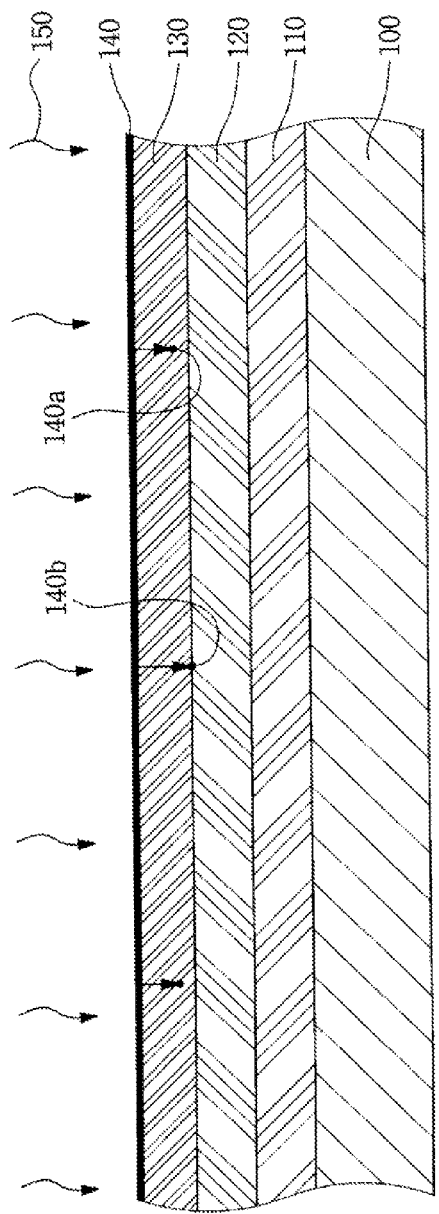
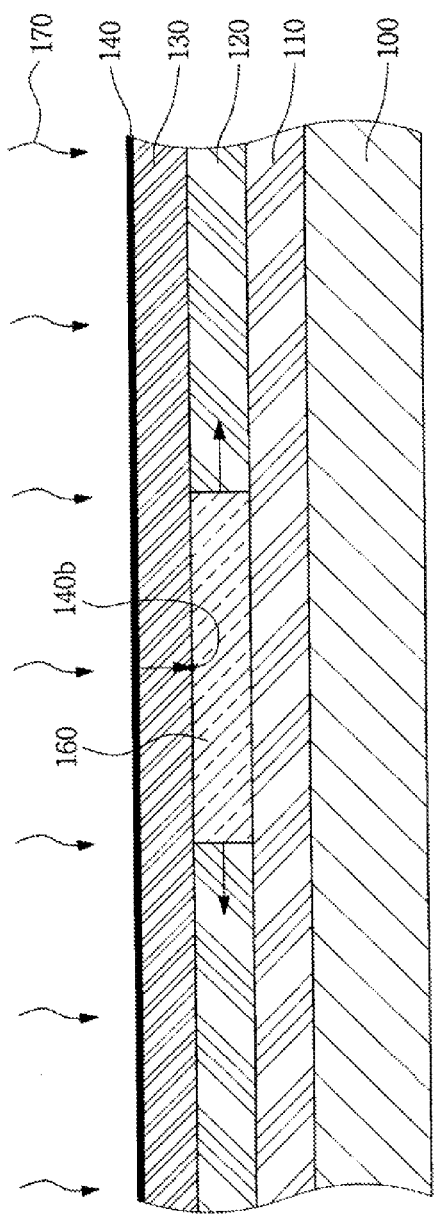

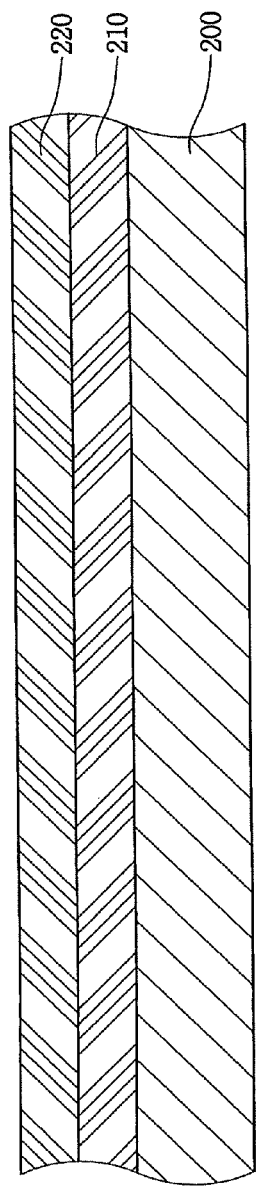
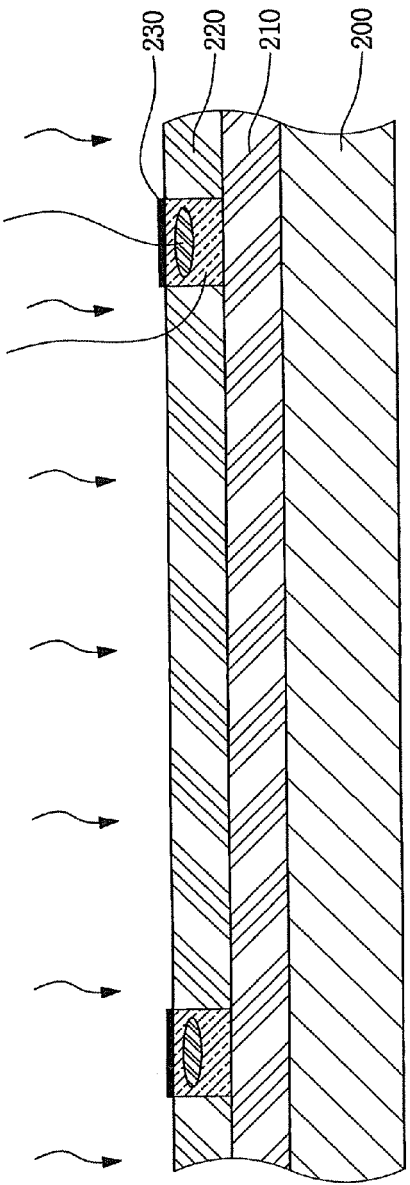

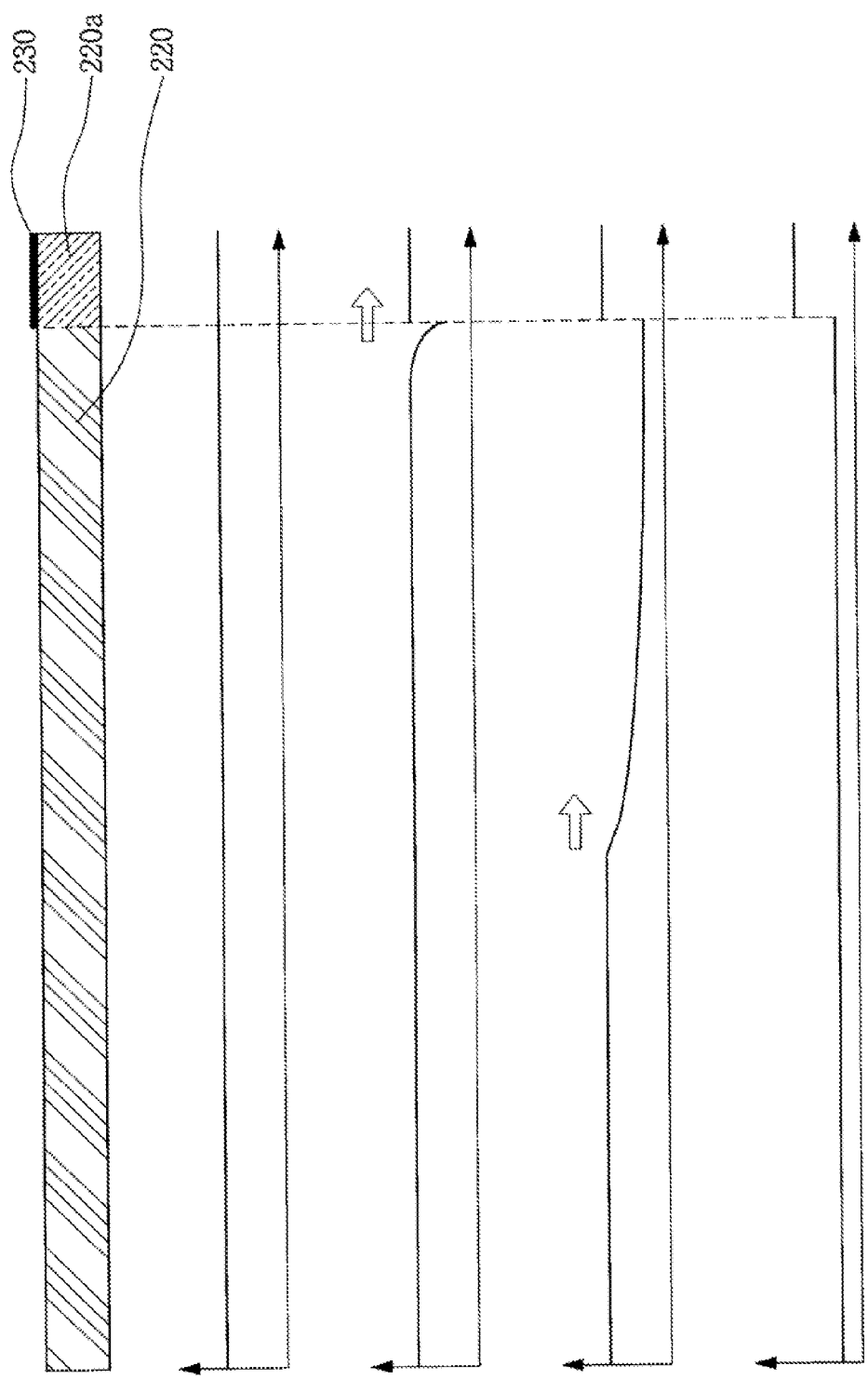

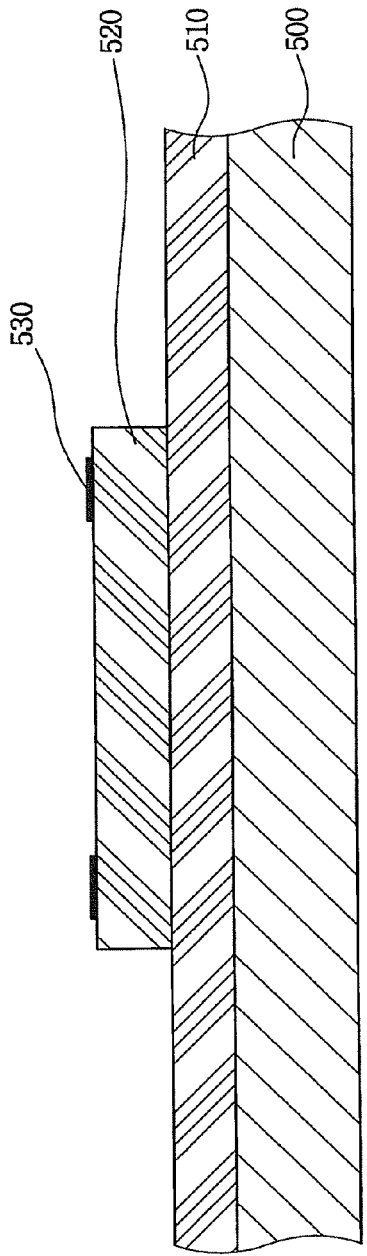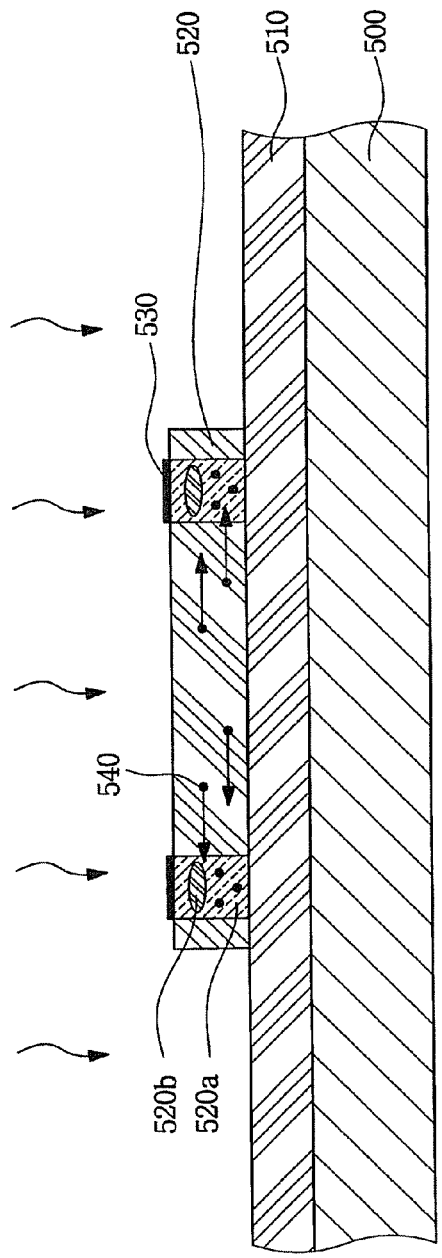

METHOD OF FABRICATING POLYCRYSTALLINE SILICON LAYER, TFT FABRICATED USING THE SAME, METHOD OF FABRICATING TFT, AND ORGANIC LIGHT EMITTING DIODE DISPLAY DEVICE HAVING THE SAME

CROSS-REFERENCE TO RELATED APPLICATIONS

This application is a divisional of U.S. patent application Ser. No. 12/130,340, filed on May 30, 2008 and claims the benefit of Korean Application No. 2007-53314, filed May 31, 2007, both of which are hereby incorporated by reference for all purpose as if fully set forth herein.

BACKGROUND OF THE INVENTION

1. Field of the Invention

Aspects of the present invention relate to a method of fabricating a polycrystalline silicon layer, a thin film transistor (TFT) fabricated using the same, a method of fabricating the TFT, and an organic light emitting diode (OLED) display device having the same. More particularly, aspects of the present invention relate to a method of fabricating a polycrystalline silicon layer, crystallized using crystallization-induced metal, wherein the method removes the crystallization-induced metal existing in a region of the polycrystalline silicon layer to be a channel by forming and annealing a metal layer or a silicide layer thereof. Aspects of the present invention further relate to a TFT having a semiconductor layer fabricated using the polycrystalline silicon layer formed by the method so as to significantly reduce a leakage current, a method of fabricating the TFT, and an OLED display device having the same.

2. Description of the Related Art

Generally, polycrystalline silicon layers have been widely used as semiconductor layers for TFTs because they have a high field-effect mobility and can be applied to high speed circuits and constitute CMOS circuits. TFTs using polycrystalline silicon layers are typically used as active elements of active-matrix liquid crystal display (AMLCD) devices and switching and driving elements of OLEDs.

Methods of crystallizing an amorphous silicon layer into a polycrystalline silicon layer include solid phase crystallization (SPC), excimer laser crystallization (ELC), metal induced crystallization (MIC) and metal induced lateral crystallization (MILC). SPC is a method of annealing an amorphous silicon layer for several to several tens of hours at a temperature at or below the transition temperature of the glass used as a substrate of a display device employing a thin film transistor (typically, about 700° C. or less). ELC is a method of crystallizing an amorphous silicon layer by irradiating the amorphous silicon layer with an excimer laser and locally heating the amorphous silicon layer to a high temperature for very short time. MIC is a method of using phase transfer induction from amorphous silicon to polysilicon by contacting is the amorphous silicon layer with metals such as nickel (Ni), palladium (Pd), gold (Au), and aluminum (Al), or implanting such metals into the amorphous silicon layer. MILC is a method of inducing sequential crystallization of an amorphous silicon layer by lateral diffusion of silicide formed by reacting metal with silicon.

However, SPC has disadvantages of a long processing time and a risk of transformation of the substrate due to the long processing time and high temperature used for the annealing. ELC has disadvantages in that expensive laser equipment is required and interfacial characteristics between a semiconductor layer and a gate insulating layer may be poor due to protrusions generated on the created polycrystallized surface. MIC and MILC have disadvantages in that a large amount of crystallization-inducing metal remains on the crystallized polycrystalline silicon layer to increase the leakage current of a semiconductor layer of a TFT.

Recently, methods of crystallizing an amorphous silicon layer using metal have been widely being studied in order to develop a way to crystallize the amorphous silicon layer in a shorter time and at a lower temperature than SPC. The crystallization methods using metal include MIC and MILC, discussed above, and super grain silicon (SGS) crystallization, discussed below. However, methods of crystallization using a crystallization-inducing metal have a problem that characteristics of the TFT may deteriorate due to contamination by the crystallization-inducing metal.

Thus, after the amorphous silicon layer is crystallized using a crystallization-inducing metal, a gettering process may be performed to remove the crystallization-inducing metal. The gettering process is generally performed using an impurity such as phosphorous or a noble gas, or by a method of forming an amorphous silicon layer on a polycrystalline silicon layer. However, even by these methods, the crystallization-inducing metals may not be is effectively removed from the polycrystalline silicon layer, and high leakage current may still be a problem.

SUMMARY OF THE INVENTION

Aspects of the present invention provide a method of fabricating a polycrystalline silicon layer crystallized using crystallization-inducing metal by removing the crystallization-inducing metal remaining in a region of the polycrystalline silicon layer to be a channel, a thin film transistor (TFT) having a semiconductor layer formed of the polycrystalline silicon layer formed by the method so as to significantly lower leakage current, a method of fabricating the same, and an organic light emitting diode (OLED) display device using the same.

According to an embodiment of the present invention, a method of removing a crystallization-inducing metal from a first predetermined region of a polycrystalline silicon layer crystallized using a crystallization-inducing metal includes providing a metal layer pattern or metal silicide layer pattern in contact with the polycrystalline silicon layer in a second predetermined region of the polycrystalline silicon layer; and performing annealing to getter the crystallization-inducing metal existing in the first predetermined region to the second predetermined region.

According to another embodiment of the present invention, a method of fabricating a polycrystalline silicon layer includes forming an amorphous silicon layer on a substrate; crystallizing the amorphous silicon layer into a polycrystalline silicon layer using crystallization-inducing metal; forming a metal layer pattern or metal silicide layer pattern in contact with an upper or lower region of the polycrystalline silicon layer corresponding to a region excluding a channel region in the polycrystalline silicon layer; and annealing the substrate to getter the crystallization-inducing metal existing in the channel region in the polycrystalline silicon layer to a region in the polycrystalline silicon layer corresponding to the metal layer pattern or metal silicide layer pattern.

According to another embodiment of the present invention, a TFT includes a substrate; a semiconductor layer disposed on the substrate and including a channel region, and source and drain regions; a metal layer pattern or metal silicide layer pattern disposed over or under the semiconductor layer corresponding to a region excluding the channel region; a gate electrode disposed to correspond to the channel region of the semiconductor layer; a gate insulating layer interposed between the gate electrode and the semiconductor layer to insulate the semiconductor layer from the gate electrode; and source and drain electrodes electrically connected to the source and drain regions of the semiconductor layer.

According to still another embodiment of the present invention, a method of fabricating a TFT includes preparing a substrate; forming an amorphous silicon layer on the substrate; crystallizing the amorphous silicon layer into a polycrystalline silicon layer using crystallization-inducing metal; forming a metal layer pattern or metal silicide layer pattern in contact with an upper or lower region of the polycrystalline silicon layer corresponding to a region excluding a channel region in the polycrystalline silicon layer; forming a gate electrode corresponding to the channel region of the polycrystalline silicon layer; forming a gate insulating layer between the gate electrode and the polycrystalline silicon layer to insulate the polycrystalline silicon layer from the gate electrode; forming source and drain electrodes electrically connected to source and drain regions of the polycrystalline silicon layer; and after forming the metal layer pattern or metal silicide layer pattern, annealing the substrate to getter the crystallization-inducing metal existing in the channel region of the polycrystalline silicon layer to a region of the polycrystalline silicon layer corresponding to the metal layer pattern or metal silicide layer pattern.

According to yet another embodiment of the present invention, an OLED display device includes: a substrate; a semiconductor layer disposed on the substrate, and including a channel region and source and drain regions; a metal layer pattern or metal silicide layer pattern disposed over or under the semiconductor layer corresponding to a region excluding the channel region; a gate electrode disposed to correspond to the channel region of the semiconductor layer; a gate insulating layer interposed between the gate electrode and the semiconductor layer to insulate the semiconductor layer from the gate electrode; source and drain electrodes electrically connected to the source and drain regions of the semiconductor layer; a first electrode electrically connected to one of the source and drain electrodes; an organic layer disposed on the first electrode; and a second electrode disposed on the organic layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1A to 1D are cross-sectional views illustrating a crystallization process according to an embodiment of the present invention;

FIGS. 2A and 2B are cross-sectional views illustrating a process of removing crystallization-inducing metal remaining in a region of a polycrystalline silicon layer to be a channel using a method of fabricating the polycrystalline silicon layer according to an embodiment of the present invention;

FIGS. 3A to 3E are cross-sectional views illustrating a polycrystalline silicon layer and a mechanism of gettering crystallization-inducing metal in the polycrystalline silicon layer;

FIGS. 5A to 5C are cross-sectional views illustrating a process of fabricating a top-gate thin film transistor using the method of fabricating the polycrystalline silicon layer according to FIGS. 2A and 2B;

DETAILED DESCRIPTION OF THE EMBODIMENTS

Figure 1A:
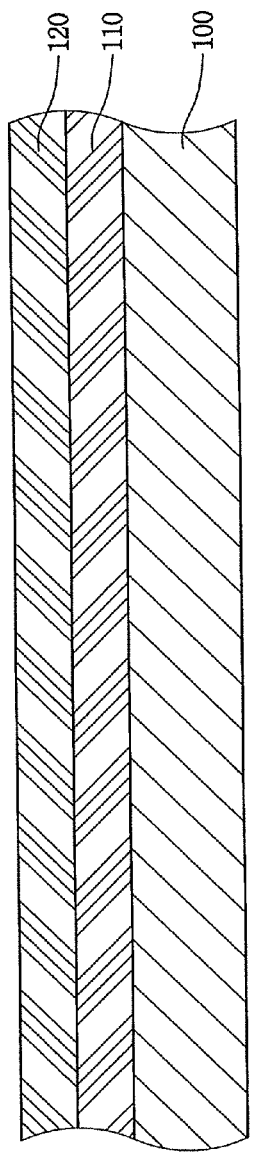

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIGS. 1A to 1D are cross-sectional views illustrating a crystallization process according to an embodiment of the present invention.

First, as illustrated in FIG. 1A, a buffer layer 110 may be formed on a substrate 100, which is formed of glass or plastic. The buffer layer 110 is an insulating layer and may be formed of silicon oxide, silicon nitride or a combination thereof by chemical vapor deposition (CVD) or physical vapor deposition (PVD). The buffer layer 110 serves to prevent the diffusion of moisture or impurities occurring in the substrate 100 or to adjust the heat transfer rate during crystallization, thereby allowing crystallization of an amorphous silicon layer to proceed easily.

Subsequently, an amorphous silicon layer 120 is formed on the buffer layer 110. As non-limiting examples, the amorphous silicon layer 120 may be formed by CVD or PVD. Also, during or after forming the amorphous silicon layer 120, a dehydrogenation process may be performed to lower the concentration of hydrogen.

Then, the amorphous silicon layer 120 is crystallized into a polycrystalline silicon layer. According to aspects of the present invention, the amorphous silicon layer is crystallized is into a polycrystalline silicon layer by a crystallization method using a crystallization-inducing metal, such as a metal induced crystallization (MIC) technique, a metal induced lateral crystallization (MILC) technique or a super grain silicon (SGS) technique.

The SGS technique is a method of crystallizing an amorphous silicon layer in which the concentration of the crystallization-inducing metal diffused into the amorphous silicon layer is lowered in order to control the grain size of the polycrystalline silicon to be within the range of several μm to several hundreds of μm. In general, lowering the concentration of the crystallization-inducing metal increases the grain size of the polycrystalline silicon produced by spacing out the sites from which crystallization proceeds. To lower the concentration of crystallization-inducing metal diffused into the amorphous silicon layer, a capping layer may be formed on the amorphous silicon layer, and a crystallization-inducing metal layer may be formed on the capping layer and annealed to diffuse the crystallization-inducing metal into the amorphous silicon layer in a controlled manner. Alternatively, a thin crystallization-inducing metal layer may be provided in order to diffuse into the amorphous silicon layer at a low concentration without the need to form the capping layer on the amorphous silicon layer.

As a specific, non-limiting example, the polycrystalline silicon layer is preferably formed by an SGS crystallization technique, which will now be described.

Figure 1B:
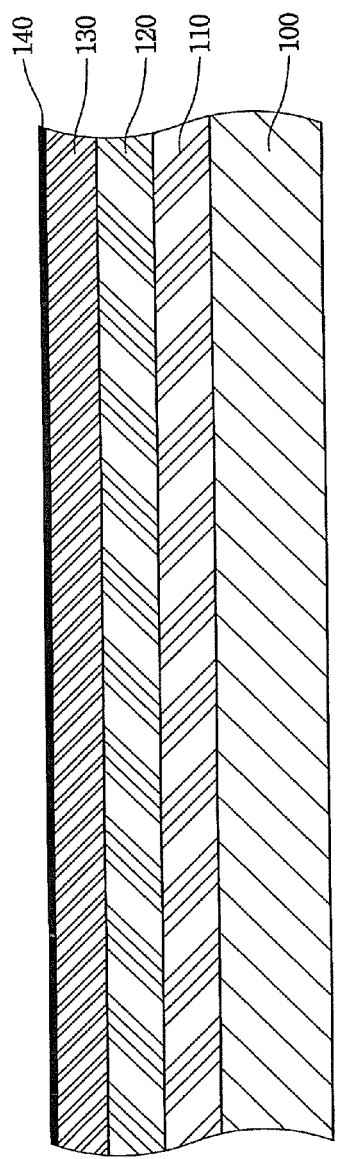

FIG. 1B is a cross-sectional view illustrating a process of forming a capping layer and a crystallization-inducing metal layer on the amorphous silicon layer. Referring to FIG. 1B, a capping layer 130 is formed on the amorphous silicon layer 120. The capping layer 130 may be formed of any material through which a crystallization metal may diffuse through annealing such as, for example, silicon nitride or a combination of silicon nitride and silicon oxide. The capping layer 130 is formed by any suitable deposition method such as, for example, CVD or PVD. As a is non-limiting example, the capping layer 130 may be formed to a thickness of 1 to 2000 Å. When the thickness of the capping layer 130 is less than 1 Å, it may be difficult to control the amount of crystallization-inducing metal that diffuses through the capping layer 130. When the thickness of the capping layer 130 is more than 2000 Å, the amount of the crystallization-inducing metal that diffuses into the amorphous silicon layer 120 may be too small, such that it may be difficult to crystallize the amorphous silicon layer into a polycrystalline silicon layer.

Subsequently, a crystallization-inducing metal is deposited on the capping layer 130 to form a crystallization-inducing metal layer 140. As non-limiting examples, the crystallization-inducing metal may be selected from the group consisting of nickel (Ni), palladium (Pd), silver (Ag), gold (Au), aluminum (Al), tin (Sn), antimony (Sb), copper (Cu), terbium (Tb) and cadmium (Cd), and Ni. As a specific, non-limiting example, the crystallization-inducing metal may be Ni. As a non-limiting example, the crystallization-inducing metal layer 140 may be formed to have a surface density of $10^{11}$ to $10^{15}$ atoms/cm$^2$ on the capping layer 130. When the crystallization-inducing metal is formed with a surface density of less than $10^{11}$ atoms/cm$^2$, the amount of a seed, i.e., a crystallization core, may be too small, and thus it may be difficult to crystallize the amorphous silicon layer into a polycrystalline silicon layer by the SGS crystallization technique. When the crystallization-inducing metal is formed with a surface density of more than $10^{15}$ atoms/cm$^2$, the amount of crystallization-inducing metal diffused into the amorphous silicon layer may be too large, such that the grains produced in the polycrystalline silicon layer are smaller in size. The amount of crystallization-inducing metal remaining in the polycrystalline layer also increases, and thus the characteristics of a semiconductor layer formed by patterning the polycrystalline silicon layer deteriorate.

FIG. 1C is a cross-sectional view illustrating a process of diffusing the crystallization-inducing metal through the capping layer to an interface of the amorphous silicon layer by annealing the substrate. Referring to FIG. 1C, the substrate 100 having the buffer layer 110, the amorphous silicon layer 120, the capping layer 130 and the crystallization-inducing metal layer 140 is annealed 150 to move some of the crystallization-inducing metal of the crystallization-inducing metal layer 140 to the surface of the amorphous silicon layer 120. That is, only a very small amount of crystallization-inducing metal 140b from the metal layer 140 diffuses through the capping layer 130 to the surface of the amorphous silicon layer 120 during the annealing, and most of the crystallization-inducing metal 140a does not reach the amorphous silicon layer 120, or does not pass at all through the capping layer 130.

Thus, the amount of crystallization-inducing metal reaching the surface of the amorphous silicon layer 120 is determined by the diffusion blocking ability of the capping layer 130, which is closely related to the thickness and/or the density of the capping layer 130. That is, as the thickness and/or the density of the capping layer 130 increases, the diffused amount of the crystallization inducing metal decreases, and thus the produced grains become larger. On the other hand, if the thickness and/or the density of the capping layer 130 decreases, the diffused amount of the crystallization inducing metal increases, and thus the produced grains become smaller.

The annealing process 150 may be performed for several seconds to several hours at a temperature of 200 to 900° C. to diffuse the crystallization-inducing metal. The annealing conditions are not limited to those described herein and may be selected to prevent a transformation of the substrate caused by excessive annealing and to enhance production costs and yield. The annealing process 150 may be one of a furnace process, a rapid thermal annealing (RTA) process, an UV process and a laser process, as non-limiting examples FIG. 1D is a cross-sectional view illustrating a process of crystallizing the amorphous silicon layer into a polycrystalline silicon layer by using the diffused crystallization-inducing metal. Referring to FIG. 1D, the amorphous silicon layer 120 is crystallized into a polycrystalline silicon layer 160 by the crystallization-inducing metals 140b that have diffused to the surface of the amorphous silicon layer 120 through the capping layer 130. That is, the diffused crystallization-inducing metal 140b bonds with silicon of the amorphous silicon layer to form metal silicide, which forms a crystallization core, i.e., a seed, and thus the amorphous silicon layer is crystallized from the seed into the polycrystalline silicon layer.

An annealing process 170 may be performed without removing the capping layer 130 and the crystallization-inducing metal layer 140, as shown in FIG. 1D. Alternatively, the polycrystalline silicon layer may be formed by diffusing the crystallization-inducing metal onto the amorphous silicon layer 120 to form metal silicide, which is a crystallization core, removing the capping layer 130 and the crystallization-inducing metal layer 140 and then annealing the bared amorphous silicon layer.

FIGS. 2A and 2B are cross-sectional views illustrating a process of fabricating a polycrystalline silicon layer according to a first embodiment of the present invention.

First, as illustrated in FIG. 2A, a substrate 200 having a buffer layer 210 and a polycrystalline silicon layer 220 formed by crystallizing an amorphous silicon layer using crystallization-inducing metal as shown in FIGS. 1A to 1D is provided.

Subsequently, as illustrated in FIG. 2B, a metal layer pattern or metal silicide layer pattern 230 is formed on a predetermined region of the polycrystalline silicon layer 220. The predetermined region is selected as a region excluding a channel region in the finished TFT. The metal layer pattern or metal silicide layer pattern 230 is formed of a metal having a smaller is diffusion coefficient in the polycrystalline silicon layer 220 than that of the crystallization-inducing metal or an alloy thereof, or silicide thereof. The metal or metal silicide of the metal layer pattern or metal silicide layer pattern 230 is selected for gettering properties, so that the crystallization-inducing metal is gettered to a region 220a in the polycrystalline silicon layer 220 corresponding to the metal layer pattern or metal silicide layer pattern 230.

The diffusion coefficient of metal or metal silicide of the metal layer pattern or metal silicide layer pattern 230 in the polycrystalline silicon layer 220 may be 1/100 or less of that of the crystallization-inducing metal. When the diffusion coefficient of the metal or metal silicide is 1/100 or less of that of the crystallization-inducing metal, the metal or metal silicide for gettering may be prevented from diffusing to another region in the polycrystalline silicon layer 220 from the region 220a corresponding to the metal layer pattern or metal silicide layer pattern 230.

Ni is widely used as the crystallization-inducing metal for crystallization into a polycrystalline silicon layer. Since Ni has a diffusion coefficient in polycrystalline silicon of approximately $10^{-5}$ cm$^2$/s or less, the diffusion coefficient of the metal or metal silicide of the metal layer pattern or metal silicide layer pattern 230 used for gettering in a polycrystalline silicon layer crystallized by Ni may be 1/100 or less of that of Ni, i.e., from 0 to $10^{-7}$ cm$^2$/s. As non-limiting examples, the metal layer pattern or metal silicide layer pattern 230 may include one selected from the group consisting of scandium (Sc), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), ruthenium (Ru), osmium (Os), cobalt (Co), rhodium (Rh), iridium (Ir), platinum (Pt), yttrium (Y), lanthanum (La), cerium (Ce), praseodymium (Pr), neodymium (Nd), dysprosium (Dy), holmium (Ho), titanium nitride (TiN), tantalum nitride (TaN), and an alloy thereof, or a silicide thereof.

The metal layer pattern or metal silicide layer pattern 230 may be formed on the polycrystalline silicon layer 220 to be spaced 50 μm or less apart from a region that will become a channel in the polycrystalline silicon layer 220. When the pattern 230 is formed to be spaced more than 50 μm apart from a channel region, the crystallization-inducing metal existing in the channel region has to diffuse farther to be gettered in region 220a corresponding to the pattern 230. Consequently, it may be necessary to anneal the substrate for a longer time, thereby transforming the substrate and making it difficult to diffuse the crystallization inducing metal to the region.

As a non-limiting example, the metal layer pattern or metal silicide layer pattern 230 may be formed to a thickness of 30 to 10000 Å. When the thickness of the pattern 230 is less than 30 Å, the crystallization-inducing metal may not be effectively gettered in the region 220a of the polycrystalline silicon layer 220 corresponding to the metal layer pattern or metal silicide layer pattern 230. When the thickness of the pattern 230, is more than 10000 Å, the pattern 230 may be too thick, and thus, peeling of the layers may occur due to stress.

When the metal layer pattern or metal silicide layer pattern 230 is formed by depositing a metal layer or a metal silicide layer only on a predetermined region of the polycrystalline silicon layer 220 and is then annealed for a subsequent gettering process, the metal layer pattern or metal silicide layer pattern 230 may be formed to a thickness of 30 to 10000 Å.

Alternatively, the metal layer pattern or metal silicide layer pattern 230 may be formed to be in contact with a predetermined region of the polycrystalline silicon layer 220 by forming an intermediate layer on the polycrystalline silicon layer 220, forming a hole in the is intermediate layer to expose the predetermined region and depositing a metal layer or a metal silicide layer on the entire surface of the intermediate layer and the exposed region. The metal layer or the metal silicide layer formed as such may be thermally expanded by annealing for the subsequent gettering to transform the substrate 200, and thus the metal layer pattern or metal silicide layer pattern 230 may be formed to a thickness of 30 to 2000 Å.

Then, the substrate 200 having the buffer layer 210, the polycrystalline silicon layer 220, and the metal layer pattern or metal silicide layer pattern 230 is annealed. The annealing process is performed to getter crystallization-inducing metal in a channel region of the polycrystalline silicon layer 220 by diffusing the crystallization-inducing metal to the region 220a in the polycrystalline silicon layer 220 corresponding to metal layer pattern or metal silicide layer pattern 230. The annealing process may be performed for 10 seconds to 10 hours. If Ni was used as the crystallization-inducing metal, the annealing may be performed at a temperature of 500 to 993° C. In particular, Ni may be difficult to diffuse to a predetermined region in the polycrystalline silicon layer 220 at less than 500° C., and may exist in a liquid phase at more than 993° C., a eutectic point of Ni.

Also, when the annealing time is less than 10 seconds, it may be difficult to sufficiently remove the crystallization-inducing metal from the channel region of the polycrystalline silicon layer 220. When the annealing time is more than 10 hours, the substrate 200 may be transformed due to the long annealing time, which is not desirable for production cost and yield.

Further, in order to improve the gettering effect, an n-type impurity or a p-type impurity may be implanted into the region 220a in the polycrystalline silicon layer 220 corresponding to the metal layer pattern or metal silicide layer pattern 230. As non-limiting examples, the n-type impurity may be phosphorous (P), and the p-type impurity may be boron (B). Also, the gettering effect may be improved by forming a damage region 220b using ions or plasma in the region 220a in the polycrystalline silicon layer 220 corresponding to the metal layer pattern or metal silicide layer pattern 230.

FIGS. 3A to 3E illustrate a polycrystalline silicon layer and a mechanism of gettering the crystallization-inducing metal in the polycrystalline silicon layer 220 using the metal layer pattern or metal silicide layer pattern 230. In particular, FIG. 3A is a cross-section of a polycrystalline silicon layer having a metal layer pattern or metal silicide layer pattern 230 and a region 220a in the polycrystalline silicon layer 220 corresponding to the metal layer pattern or metal silicide layer pattern 230. FIGS. 3B to 3E are graphs that represent the concentration of the crystallization-inducing metal at the corresponding lateral positions of the polycrystalline silicon layer 220 of FIG. 3A at successive periods of time before (FIG. 3B), during (FIG. 3C to 3D) and after (FIG. 3E) the annealing.

First, referring to FIG. 3B, before annealing the substrate 200, the concentration of the crystallization-inducing metal in the polycrystalline silicon layer 220 is constant. During annealing, in the case of a metal layer pattern 230, the metal of the metal layer pattern 230 bonds with silicon of the polycrystalline silicon layer 220 to form a metal silicide in the region 220a in the polycrystalline silicon layer 220 corresponding to the metal layer pattern or metal silicide layer pattern 230; in the case of a metal silicide layer pattern, the metal silicide of the metal silicide layer pattern moves to the region 220a in the polycrystalline silicon layer 220. Moreover, when the substrate 200 is annealed, the crystallization-inducing metal existing in the polycrystalline silicon layer 220, and which has a high diffusion coefficient in the polycrystalline silicon layer 220, begins to randomly diffuse in the polycrystalline silicon layer 220.

During the annealing, when the randomly moving crystallization-inducing metal diffuses into the region 220a in the polycrystalline silicon layer 220 corresponding to the metal layer pattern or metal silicide layer pattern 230, the crystallization-inducing metal in the region 220a having the different metal silicide is thermodynamically more stable than the crystallization-inducing metal in a region in the polycrystalline silicon layer having no metal layer pattern or metal silicide layer pattern 230. Thus, the crystallization-inducing metal that diffuses to the region 220a cannot escape.

As a result, referring to FIG. 3C, the concentration of the crystallization-inducing metal in the polycrystalline silicon layer 220 adjacent to the region 220a corresponding to the metal layer pattern or metal silicide layer pattern 230 gradually decreases, and thus a concentration difference occurs between the region 220a and a region far from the region 220a in the polycrystalline silicon layer 220.

Referring to FIG. 3D, due to the concentration difference, the crystallization-inducing metal in the polycrystalline layer 220 far away from the region 220a corresponding to the metal layer pattern or metal silicide layer pattern 230 also diffuses to a region adjacent to the region 220a.

Consequently, referring to FIG. 3E, most of the crystallization-inducing metals in the polycrystalline silicon layer 220 diffuse to the region 220a corresponding to the metal layer pattern or metal silicide layer pattern 230 to be gettered over time, and thus only a few crystallization-inducing metals remain outside the region 220a. According to this principle, the crystallization-inducing metal remaining in a region to be a channel in the polycrystalline silicon layer 220 may be removed using the metal layer pattern or metal silicide layer pattern 230.

Figure 4:
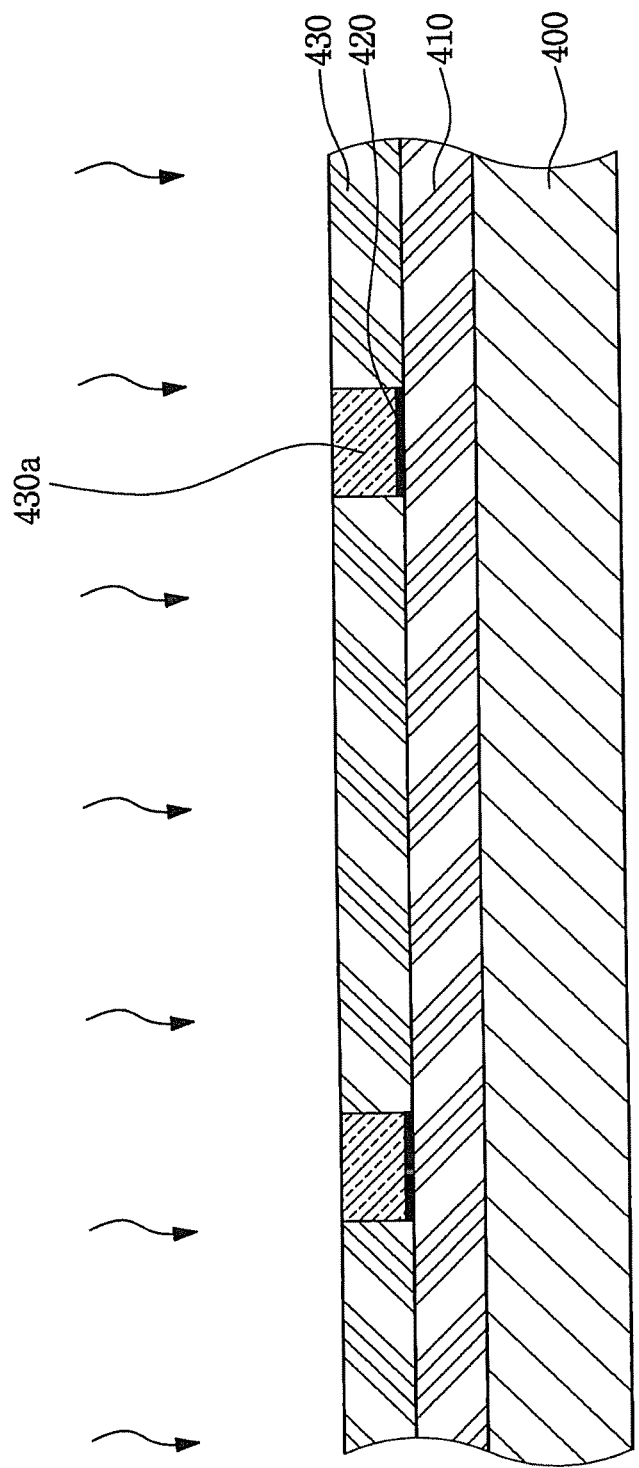
FIG. 4 is a cross-sectional view illustrating a process of removing crystallization-inducing metal remaining in a region of a polycrystalline silicon layer to be a channel using a method of fabricating the polycrystalline silicon layer according to another embodiment of the present invention.

FIG. 4 is a cross-sectional view illustrating a process of fabricating a polycrystalline silicon layer using a method of fabricating the polycrystalline silicon layer according to a second embodiment of the present invention. Except for particular descriptions in the second embodiment that differ from the first embodiment, the process will be described with reference to the descriptions in the first embodiment.

First, a substrate 400 having a buffer layer 410 is provided. Then, a metal layer pattern or metal silicide layer pattern 420 is formed in a predetermined region on the buffer layer 410 to correspond to a region that does not include where a channel region will be formed later.

Subsequently, an amorphous silicon layer is formed on the substrate 400 having the metal layer pattern or metal silicide layer pattern 420, and crystallized into a polycrystalline silicon layer 430 using crystallization-inducing metal as described in the embodiment of FIGS. 1A through 1D. Here, during annealing for crystallization, a gettering process in which the crystallization-inducing metal moves to a region 430a in the polycrystalline silicon layer 430 corresponding to the metal layer pattern or metal silicide layer pattern 420 may be simultaneously performed.

Then, the substrate 400 having the buffer layer 410, the metal layer pattern or metal silicide layer pattern 420 and the polycrystalline silicon layer 430 is annealed. The annealing process allows the crystallization-inducing metal existing in the region that will form a channel in the polycrystalline silicon layer 430 to diffuse to the region 430a in the polycrystalline silicon layer 430 corresponding to the metal layer pattern or metal silicide layer pattern 420 so as to getter the crystallization-inducing metal in the channel region of the polycrystalline silicon layer 430.

Figure 5C:
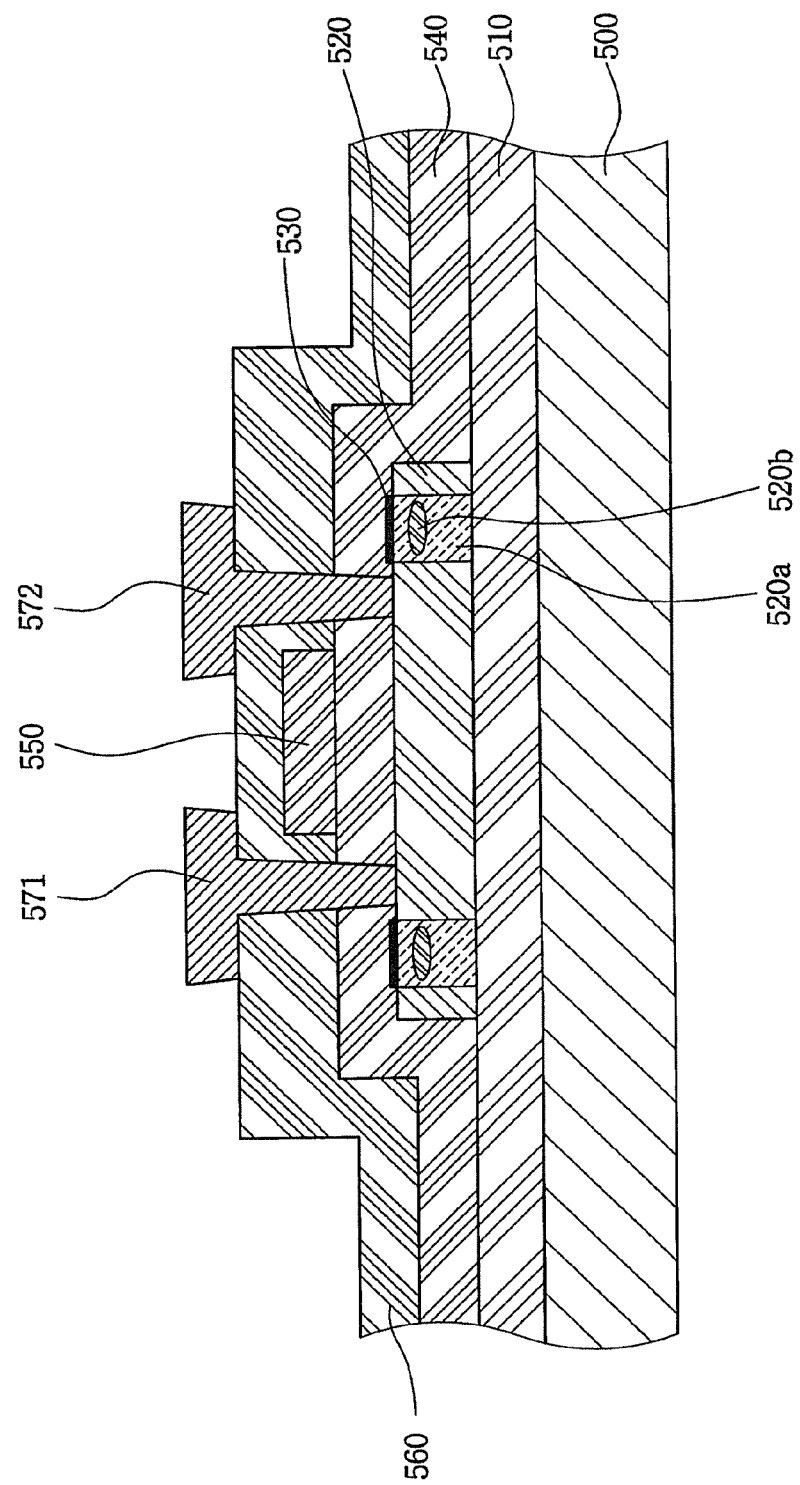

FIGS. 5A to 5C are cross-sectional views illustrating a process of fabricating a top-gate thin film transistor (TFT) including fabricating a polycrystalline silicon layer according to the first embodiment of the present invention.

Referring to FIG. 5A, a buffer layer 510 may be formed of silicon oxide, silicon nitride or a combination thereof on a substrate 500, which is formed of glass, stainless steel or plastic. The buffer layer 510 serves to prevent the diffusion of moisture or impurities generated on the substrate 500 and/or adjusts a heat transfer rate in crystallization so the amorphous silicon layer is crystallized easily.

Subsequently, an amorphous silicon layer is formed on the buffer layer 510, and crystallized into a polycrystalline silicon layer using crystallization-inducing metal as in the embodiment of FIGS. 1A through 1D. The polycrystalline silicon layer is patterned to form a semiconductor layer 520. Alternatively, the patterning process of polycrystalline silicon layer may be performed in a subsequent process.

Then, a metal layer pattern or metal silicide layer pattern 530 is formed on the semiconductor layer 520 to be in contact with a top surface of a region excluding the region that will become a channel controlling the current of a TFT.

The metal layer pattern or metal silicide layer pattern 530 may be formed on the semiconductor layer 520 to be spaced 50 µm or less apart from the region to be a channel in the semiconductor layer 520. When the metal layer pattern or metal silicide layer pattern 530 is formed in a region spaced more than 50 µm apart from the channel region, the crystallization-inducing metal existing in the channel region has to diffuse farther to be gettered in this region. In this case, due to a longer annealing needed to diffuse the crystallization-inducing metal over a longer distance, the substrate may be transformed, and thus the crystallization-inducing metal may be difficult to diffuse to this region.

Then, referring to FIG. 5B, the metal layer pattern or metal silicide layer pattern 530 may be formed to a thickness of 30 to 10000 Å. When the thickness is less than 30 Å, the crystallization-inducing metal may not be effectively gettered in the region of the semiconductor layer 520 corresponding to the metal layer pattern or metal silicide layer pattern 530. However, when the thickness is more than 10000 Å, the metal layer pattern or metal silicide layer pattern 530 becomes thick, and thus peeling of the layers may occur due to stress.

Then, the substrate 500 having the buffer layer 510, the semiconductor layer 520 and the metal layer pattern or metal silicide layer pattern 530 is annealed, thereby diffusing the crystallization-inducing metal remaining in the channel region of the semiconductor layer 520 to a region 520a in the semiconductor layer 520 corresponding to the metal layer pattern or metal silicide layer pattern 530 to be gettered. The annealing process is the same as that described in the method of fabricating the polycrystalline silicon layer, and may be performed at any time after forming the metal layer pattern or metal silicide layer pattern 530. As a result of the annealing process, the concentration of the crystallization-inducing metal remaining in the channel region of the semiconductor layer 520 is reduced to under $10^{13}$ atoms/cm$^2$. After annealing, the metal layer pattern or metal silicide layer pattern 530 may be removed.

Meanwhile, in order to improve gettering effect, an n-type impurity or a p-type impurity may be further implanted into a region 520a in the semiconductor layer 520 corresponding to the metal layer pattern or metal silicide layer pattern 530. As non-limiting examples, the n-type impurity may be phosphorus (P), and the p-type impurity may be boron (B). Also, a damage region 520b may be formed using ions or plasma in the region 520a in the semiconductor layer 520 corresponding to the metal layer pattern or metal silicide layer pattern 530 so as to improve the gettering effect.

Then, referring to FIG. 5C, a gate insulating layer 540 is formed on the is semiconductor layer 520 having the metal layer pattern or metal silicide layer pattern 530. As non-limiting examples, the gate insulating layer 540 may be formed of silicon oxide, silicon nitride or a combination thereof.

Subsequently, a metal layer for a gate electrode (not illustrated) is formed on the gate insulating layer 540 using a single layer of Al or an Al alloy such as Al—Nd, or a multilayer having an Al alloy on a Cr or Mo alloy, and a gate electrode 550 is formed to correspond to a channel region of the semiconductor layer 520 by etching the metal layer for a gate electrode using a photolithography process.

Then, an interlayer insulating layer 560 is formed on the entire surface of the substrate having the gate electrode 550. As non-limiting examples, the interlayer insulating layer 560 may be formed of silicon oxide, silicon nitride or a combination thereof.

After that, the interlayer insulating layer 560 and the gate insulating layer 540 are etched to form contact holes exposing source and drain regions of the semiconductor layer 520. Source and drain electrodes 571 and 572 connected to the source and drain regions through the contact holes are formed. As non-limiting examples, the source and drain electrodes 571 and 572 may be formed of a material selected from the group consisting of Mo, Cr, W, MoW, Al, Al—Nd, Ti, TiN, Cu, a Mo alloy, an Al alloy and a Cu alloy. Thus, a TFT having the semiconductor layer 520, the gate electrode 550 and the source and drain electrodes 571 and 572 is completed.

Figure 6A:
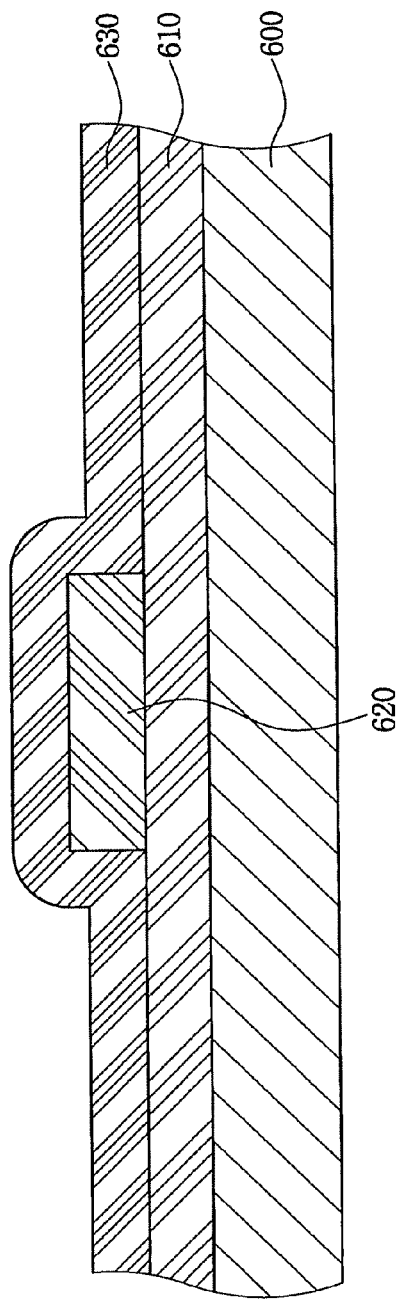
FIGS. 6A to 6C are cross-sectional views illustrating a process of fabricating a bottom-gate thin film transistor using the method of fabricating the polycrystalline silicon layer according to the FIGS. 2A and 2B.
Figure 6B:
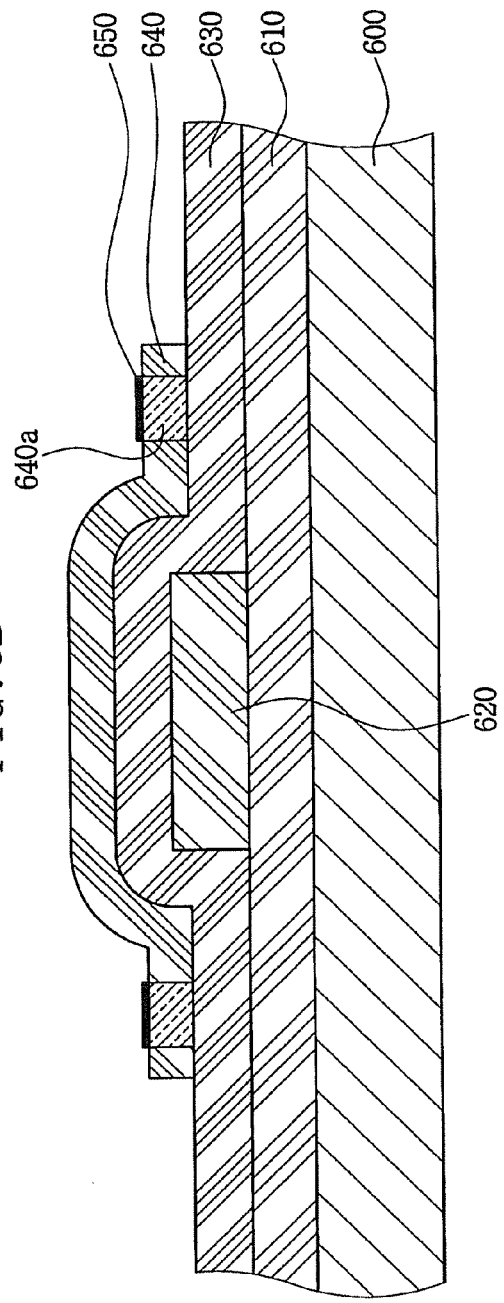
Figure 6C:
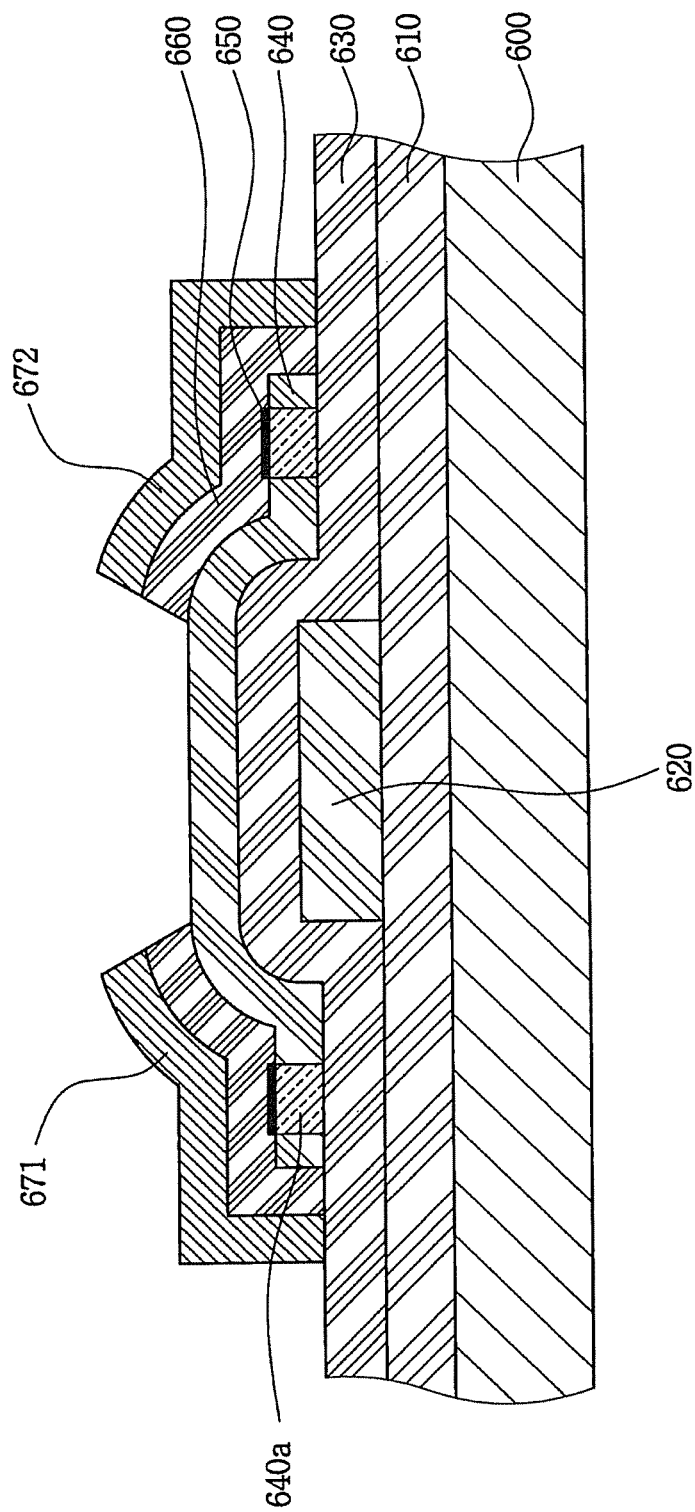

FIGS. 6A to 6C are cross-sectional views illustrating a process of fabricating a bottom-gate TFT using the method of fabricating a polycrystalline silicon layer according to the first embodiment of the present invention. Except particular descriptions below, the process will be described with reference to the descriptions in the above embodiment.

Referring to FIG. 6A, a buffer layer 610 is formed on a substrate 600. A metal is layer for a gate electrode (not illustrated) is formed on the buffer layer 610, and a gate electrode 620 is formed by etching the metal layer for a gate electrode using a photolithography process. Then, a gate insulating layer 630 is formed on the substrate 600 having the gate electrode 620.

Subsequently, referring to FIG. 6B, an amorphous silicon layer is formed on the gate insulating layer 630, and then crystallized into a polycrystalline silicon layer using crystallization-inducing metal as described in the embodiment of FIGS. 1A through 1D. The polycrystalline silicon layer is patterned to form a semiconductor layer 640. Alternatively, the patterning may be performed in a subsequent process.

Then, a metal layer pattern or metal silicide layer pattern 650 is formed on the top surface of the semiconductor layer 640 excluding a region that will be a channel controlling current in the TFT by the same method as that described in the method of fabricating a polycrystalline silicon layer according to the first embodiment of the present invention. Alternatively, the metal layer pattern or metal silicide layer pattern 650 may be formed on the gate insulating layer 630 before forming the amorphous silicon layer that forms the semiconductor layer 640.

Subsequently, the substrate 600 having the buffer layer 610, the gate electrode 620, the gate insulating layer 630, the semiconductor layer 640 and the metal layer pattern or metal silicide layer pattern 650 is annealed to diffuse the crystallization-inducing metal remaining in the channel region of the semiconductor layer 640 to a region 640a in the semiconductor layer 640 corresponding to the metal layer pattern or metal silicide layer pattern 650, so as to getter the crystallization-inducing metal. The annealing process is the same as described in the method of fabricating the polycrystalline silicon layer, and may be performed at any time after forming the metal layer pattern or metal silicide layer pattern 650. After the is annealing process, the metal layer pattern or metal silicide layer pattern 650 may be removed.

Then, referring to FIG. 6C, an ohmic contact material layer and source and drain conductive layers are sequentially stacked on the semiconductor layer 640 having the metal layer pattern or metal silicide layer pattern 650, and patterned to form source and drain electrodes 671 and 672 and an ohmic contact layer 660. As a non-limiting example, the ohmic contact layer 660 may be an impurity-doped amorphous silicon layer.

The source and drain conductive layers and the ohmic contact material layer may be patterned using a single mask, thereby avoiding the extra time and expense of using a separate mask for each layer. Thus, the ohmic contact layer 660 may be disposed under the entire surface of the source and drain electrodes 671 and 672. The ohmic contact layer 660 may be interposed between the semiconductor layer 640 and the source and drain electrodes 671 and 672 to ohmically contact the semiconductor layer 640 with the source and drain electrodes 671 and 672. Alternatively, the ohmic contact layer 660 may be omitted. In this case, before stacking the source and drain conductive layers, a conductive region may be formed in the semiconductor layer 640 to be in ohmic contact with the source and drain electrodes 671 and 672. Thus, a bottom gate TFT including the gate electrode 620, the semiconductor layer 640 and the source and drain electrodes 671 and 672 is completed.

Figure 7A:
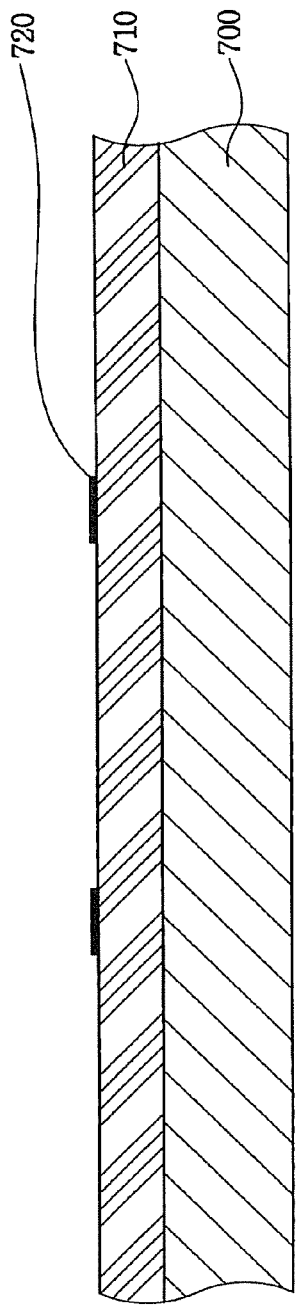
FIGS. 7A to 7C are cross-sectional views illustrating a process of fabricating a top-gate thin film transistor using the method of fabricating the polycrystalline silicon layer according to FIG. 4.
Figure 7B:
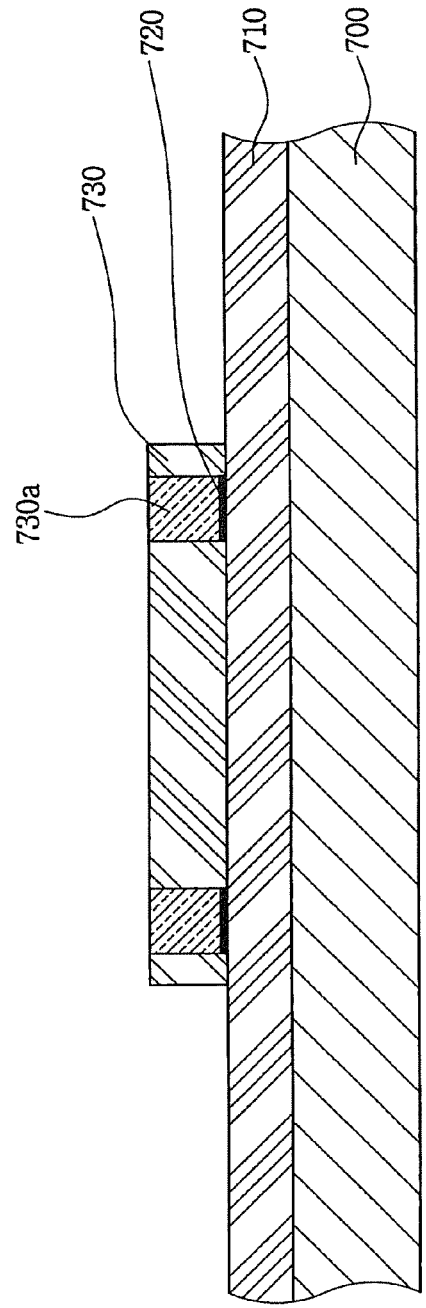
Figure 7C:
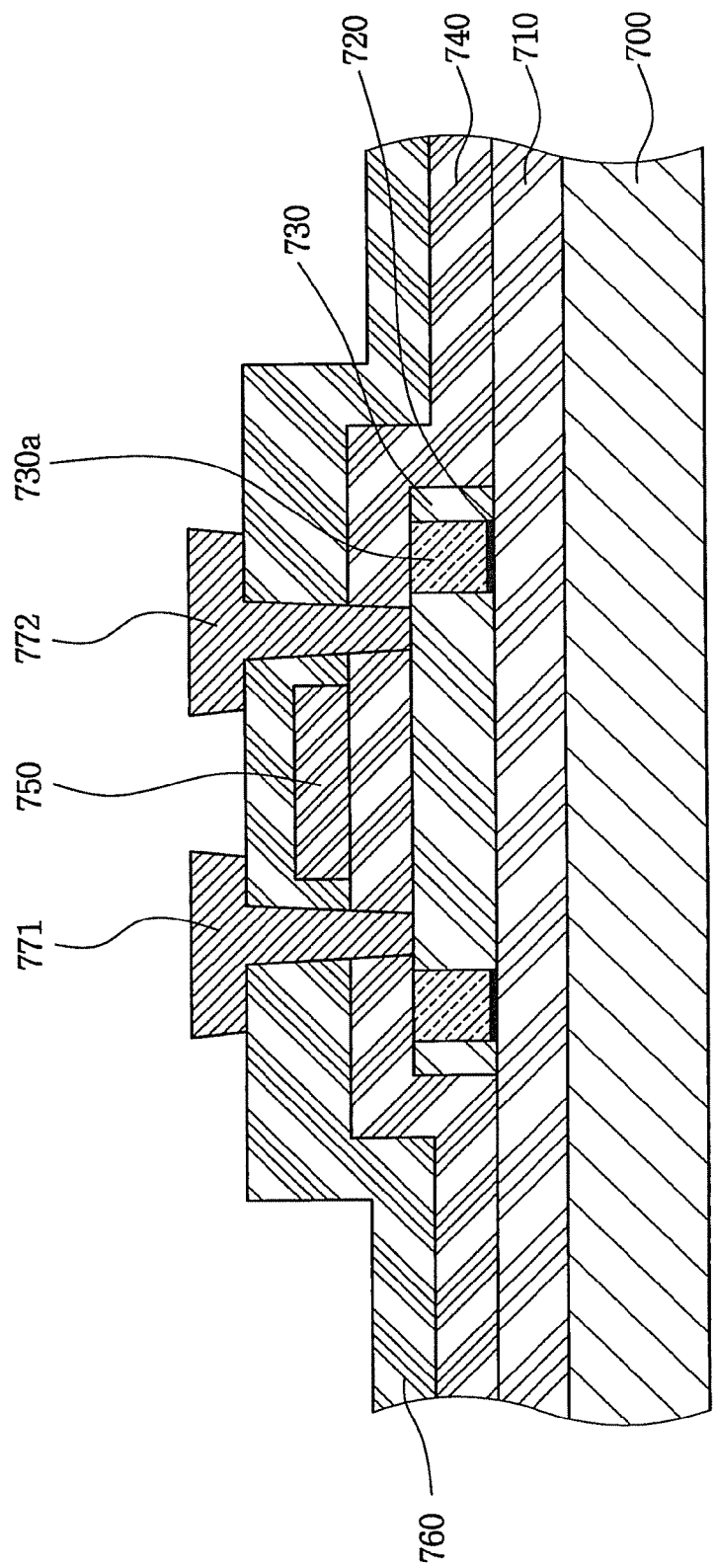

FIGS. 7A to 7C are cross-sectional views illustrating a process of fabricating a top-gate TFT using the method of fabricating a polycrystalline silicon layer according to the second embodiment of the present invention. Except for particular descriptions below, the process will be described with reference to the descriptions as in the above second embodiment.

First, referring to FIG. 7A, a substrate 700 having a buffer layer 710 is provided. Then, a metal layer pattern or metal silicide layer pattern 720 is formed in a predetermined is region on the buffer layer 710 to correspond to a region that is outside a channel region in a semiconductor layer to be formed later.

Subsequently, referring to FIG. 7B, an amorphous silicon layer is formed on the substrate 700 having the metal layer pattern or metal silicide layer pattern 720, and crystallized into a polycrystalline silicon layer using crystallization-inducing metal as described in the embodiment of FIGS. 1A to 1D. The polycrystalline silicon layer is patterned to form a semiconductor layer 730. Alternatively, the patterning may be performed in a subsequent process.

Then, the substrate 700 having the buffer layer 710, the metal layer pattern or metal silicide layer pattern 720 and the semiconductor layer 730 is annealed, thereby diffusing the crystallization-inducing metal remaining in a channel region of the semiconductor layer 730 to a region 730a in the semiconductor layer 730 corresponding to the metal layer pattern or metal silicide layer pattern 720 so as to getter the crystallization-inducing metal in the channel region of the semiconductor layer 730. The annealing process may be performed at any time after forming the metal layer pattern or metal silicide layer pattern 720.

Subsequently, referring to FIG. 7C, a gate insulating layer 740 is formed on the semiconductor layer 730. Then, a metal layer for a gate electrode (not illustrated) is formed, and a gate electrode 750 is formed to correspond to the channel region of the semiconductor layer 730 by etching the metal layer for a gate electrode using a photolithography process.

After that, an interlayer insulating layer 760 is formed on the entire surface of the substrate having the gate electrode 750, and the interlayer insulating layer 760 and the gate insulating layer 740 are etched to form contact holes exposing source and drain regions of the semiconductor layer 730. Source and drain electrodes 771 and 772 connected to the source and drain regions through the contact holes are formed. Thus, a TFT having the semiconductor layer 730, the gate electrode 750 and the source and drain electrodes 771 and 772 is completed.

While, in the present embodiment, the top-gate TFT having a gate electrode formed on a gate insulating layer is described, it may be understood to those of ordinary skill in the art that the present invention may be modified and transformed in various ways, for example, in application to a bottom-gate TFT, without departing from the scope of the present invention.

Figure 8:
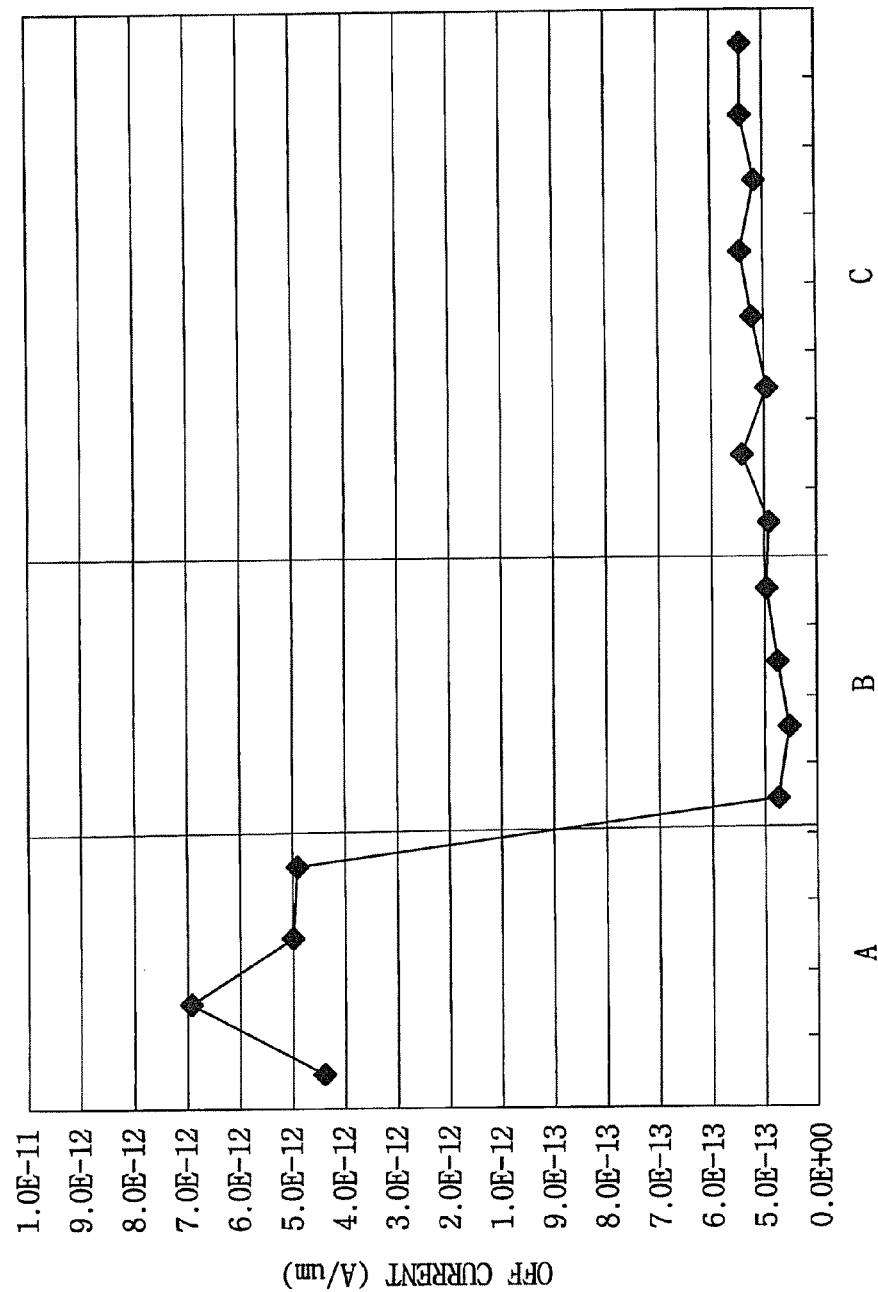
FIG. 8 is a comparison graph of off-current values per unit width between semiconductor layers of a thin film transistor formed by a method of fabricating a polycrystalline silicon layer according to an exemplary embodiment of the present invention, and a thin film transistor formed by a conventional gettering method by phosphorous-doping.

FIG. 8 is a comparison graph of off-currents per unit width (A/μm) between a semiconductor layer of a TFT formed by a conventional gettering method through phosphorus (P) doping and a semiconductor layer of a TFT formed by a method of fabricating a polycrystalline silicon layer according to aspects of the present invention. Here, section A on a horizontal axis denotes a TFT using the conventional gettering method by P-doping, and sections B and C denote a TFT using the method of fabricating a polycrystalline silicon layer according to the present invention, wherein in section B, Ti was used in the metal layer pattern, and in section C, Mo was used in the metal layer pattern. The vertical axis denotes an off-current per unit width (A/μm) of a semiconductor layer in a TFT.

The conventional gettering method by P-doping was performed by doping phosphorus into a region excluding the channel of a semiconductor layer at a dose of $2*e^{14}/cm^2$, and annealing the semiconductor layer for an hour at 550° C. The method of fabricating a polycrystalline silicon layer according to aspects of the present invention was performed by depositing Ti or Mo to have a thickness of 100 Å on the region excluding the channel of a semiconductor layer, respectively, and annealing the semiconductor layer under the same conditions as those described in the gettering method by P-doping. After annealing, the off-currents per unit width of the semiconductor layer of each transistor were measured.

According to aspects of the present invention, when depositing Ti or Mo onto a region of a semiconductor layer and annealing the semiconductor layer for gettering, Ti or Mo reacts with Si of the semiconductor layer to form Ti silicide or Mo silicide. In a lower region of the semiconductor layer in contact with the Ti or Mo layer, a region is formed in which Ti silicide or Mo silicide is grown from an interface of the semiconductor layer, and crystallization-inducing metal is gettered therein.

Referring to section A of FIG. 8, the off-current per unit width of the semiconductor layer of the TFT using the conventional gettering method by P-doping was approximately $4.5 E^{-12}$ to $7.0 E^{-12}$ (A/μm). In contrast, referring to sections B and C of FIG. 8, the off-current per unit width of the semiconductor layer of the TFT by the method of fabricating a polycrystalline silicon layer according to aspects of the present invention using Ti was $5.0 E^{-13}$ (A/μm) or less, and that using Mo was $6.0 E^{-13}$ (A/μm) or less. Thus, it may be seen that the off-current per unit width was significantly lowered in a TFT according to aspects of the present invention in comparison to a TFT formed according to the conventional method.

Consequently, by using the method of fabricating a polycrystalline silicon layer according to aspects of the present invention, it may be seen that the amount of crystallization-inducing metal remaining in the channel region of the semiconductor layer, which affects an off-current of a TFT, drastically decreases, and thus a TFT having a significantly low leakage current and an excellent electrical characteristic may be provided.

Figure 9:
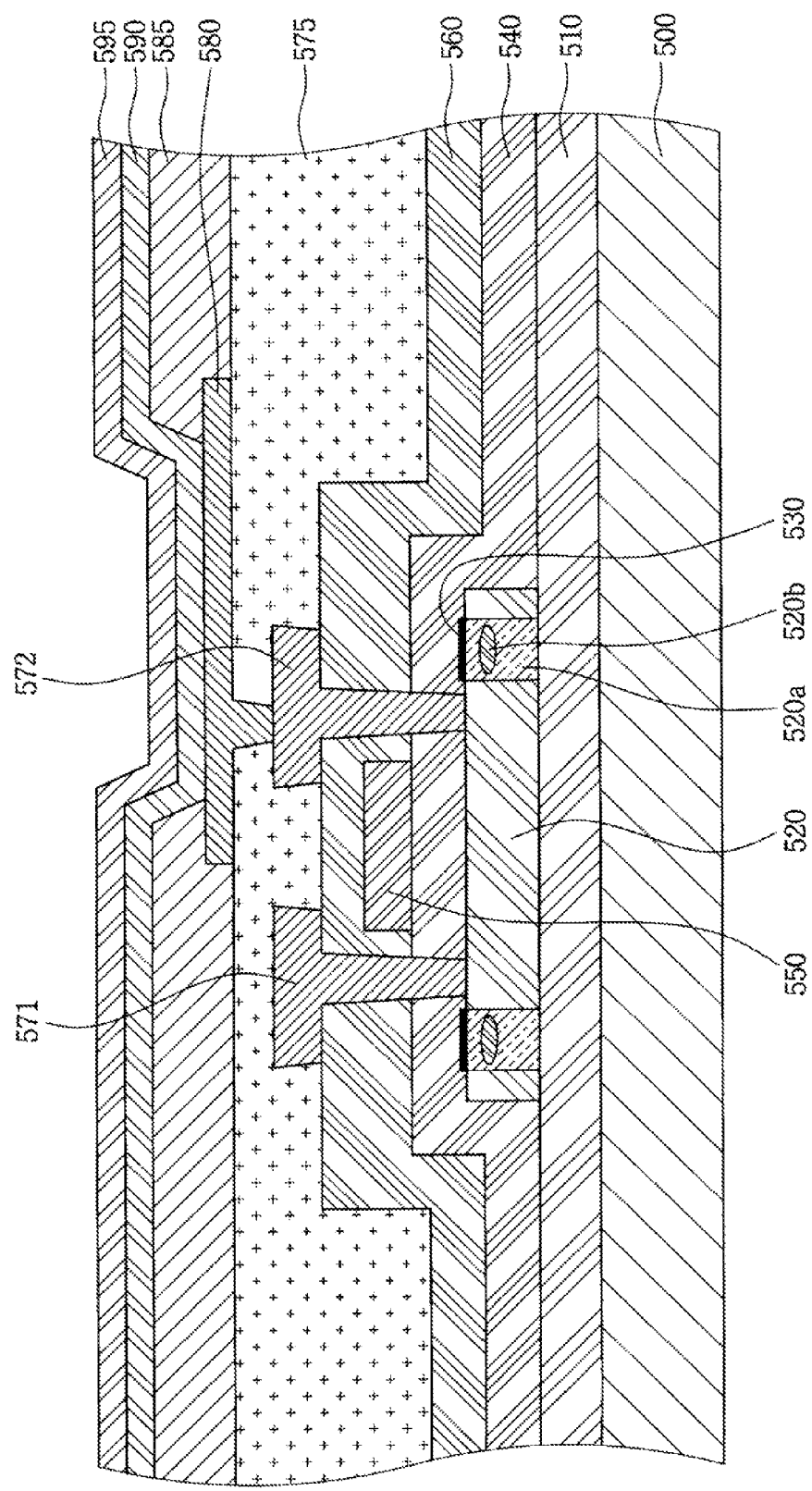
FIG. 9 is a cross-sectional view of an organic light emitting diode (OLED) display device including a thin film transistor formed by the method of fabricating the polycrystalline silicon layer according to FIGS. 2A and 2B.

FIG. 9 is a cross-sectional view of an organic light emitting diode (OLED) display device including a TFT according to an embodiment of the present invention.

Referring to FIG. 9, an insulating layer 575 is formed on the entire surface of the substrate 500 including the TFT according to the embodiment of FIG. 5C. The insulating layer 575 may be an inorganic layer formed of a material selected from the group consisting of silicon oxide, silicon nitride and silicate on glass, or an organic layer formed of a material selected from the group consisting of polyimide, benzocyclobutene series resin and acrylate. Also, the insulating layer may be formed by stacking the inorganic layer and the organic layer.

A via hole exposing the source or drain electrode 571 or 572 is formed by etching the insulating layer 575. A first electrode 580 connected to one of the source and drain electrodes 571 and 572 through the via hole is formed. The first electrode 580 may be an anode or a cathode. When the first electrode 580 is an anode, the anode may be formed of a transparent conductive layer formed of ITO, IZO or ITZO, and when the first electrode 580 is a cathode, the cathode may be formed of Mg, Ca, Al, Ag, Ba or an alloy thereof.

Then, a pixel defining layer 585 having an opening that partially exposes the surface of the first electrode 580 is formed on the first electrode 580, and an organic layer 590 including an emission layer is formed on the exposed first electrode 580. The organic layer 590 may further include at least one of a hole injection layer, a hole transport layer, a hole blocking layer, an electron blocking layer, an electron injection layer and an electron transport layer. Then, a second electrode 595 is formed on the organic layer 590. Thus, an OLED display device according to the embodiment of the present invention is completed.

In summary, in a polycrystalline silicon layer crystallized using crystallization-inducing metal, a metal layer pattern or metal silicide layer pattern including a metal or an alloy thereof having a smaller diffusion coefficient than the crystallization-inducing metal in the polycrystalline silicon layer may be formed over or under a predetermined region corresponding to a region that a channel in the polycrystalline silicon layer and then the polycrystalline silicon layer may be annealed, thereby removing the crystallization-inducing metal existing in the channel region of the polycrystalline silicon layer. As a result, an off-current of a TFT containing the semiconductor layer may be significantly reduced, and a TFT having an excellent electrical characteristics and an OLED display device including the same may be provided.

According to aspects of the present invention as described above, crystallization-inducing metal existing in a channel region of a polycrystalline silicon layer may be completely removed, and the region of the polycrystalline silicon layer from which the crystallization-inducing metal is completely removed may be used as a channel region of a TFT, and thus a TFT having an excellent electrical characteristic such as a low off-current, a method of fabricating the same, and an OLED display device including the TFT may be provided.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of removing a crystallization-inducing metal from a first predetermined region of a polycrystalline silicon layer crystallized using a crystallization-inducing metal, the method comprising:
   providing a metal layer pattern or metal silicide layer pattern in contact with an upper or lower surface of the polycrystalline silicon layer in a second predetermined region of the polycrystalline silicon layer; and
   performing annealing to getter the crystallization-inducing metal existing in the first predetermined region to the second predetermined region.

2. The method of claim 1, wherein the providing of the metal layer pattern or metal silicide layer pattern in contact with the polycrystalline silicon layer in a second predetermined region of the polycrystalline silicon layer is carried out by forming the metal layer pattern or metal silicide layer pattern on the polycrystalline silicon layer in the second predetermined region of the polycrystalline silicon layer.

3. The method of claim 1, wherein the providing of the metal layer pattern or metal silicide layer pattern in contact with the polycrystalline silicon layer in a second predetermined region of the polycrystalline silicon layer is carried out by forming the metal layer pattern or metal silicide layer pattern on a substrate, forming an amorphous silicon layer such that a first region of the amorphous silicon layer that becomes the first predetermined region contacts the substrate and a second region of the amorphous silicon layer that becomes the second predetermined region contacts the metal layer pattern or metal silicide layer pattern and crystallizing the amorphous silicon layer using a crystallization-inducing metal to form the polycrystalline silicon layer.

4. The method of claim 1, wherein the second predetermined region is formed at a distance of 50 μm or less from the first predetermined region.

5. The method according to claim 1, wherein the metal or metal silicide included in the metal layer pattern or metal silicide layer pattern has a smaller diffusion coefficient than the diffusion coefficient of the crystallization-inducing metal in the polycrystalline silicon layer.

6. The method according to claim 5, wherein the metal or metal silicide included in the metal layer pattern or metal silicide layer pattern has a diffusion coefficient of 1/100 or less of the diffusion coefficient of the crystallization-inducing metal.

7. The method according to claim 6, wherein the crystallization-inducing metal comprises nickel, and the diffusion coefficient of the metal or metal silicide included in the metal layer pattern or metal silicide layer pattern is from more than 0 to $10^{-7}$ cm$^2$/s.

8. The method according to claim 6, wherein the metal layer pattern or metal silicide layer pattern comprises one selected from the group consisting of scandium (Sc), titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), ruthenium (Ru), osmium (Os), cobalt (Co), rhodium (Rh), iridium (Ir), platinum (Pt), yttrium (Y), lanthanum (La), cerium (Ce), praseodymium (Pr), neodymium (Nd), dysprosium (Dy), holmium (Ho), titanium nitride (TiN), tantalum nitride (TaN) and an alloy or silicide thereof.

9. The method according to claim 1, wherein the annealing is performed for 10 seconds to 10 hours at a temperature of 500 to 993° C.

10. The method of claim 1, wherein the metal layer pattern or metal silicide layer pattern when formed does not include any metal or metal silicide having a diffusion coefficient greater than $10^{-7}$ cm$^2$/s.

11. The method according to claim 1, wherein the polycrystalline silicon layer crystallized using a crystallization-inducing metal is formed by a metal-induced crystallization (MIC) technique, a metal-induced lateral crystallization (MILC) technique or a super grain silicon (SGS) technique.

12. The method according to claim 1, wherein the metal layer pattern or metal silicide layer pattern is formed to a thickness of 30 to 10000 Å.

13. The method according to claim 12, wherein the metal layer pattern or metal silicide layer pattern is formed to a thickness of 30 to 2000 Å.

14. The method according to claim 1, further comprising:
   implanting an n-type impurity or a p-type impurity into the region of the polycrystalline silicon layer corresponding to the metal layer pattern or metal silicide layer pattern, or forming a damage region in the region of the semiconductor layer corresponding to the metal layer pattern or metal silicide layer pattern using ions or plasma.

15. The method according to claim 1, wherein the first predetermined region is a channel region in the polycrystalline silicon layer.

16. A method of fabricating a thin film transistor, comprising:
   preparing a substrate;
   forming an amorphous silicon layer on the substrate;
   crystallizing the amorphous silicon layer into a polycrystalline silicon layer using crystallization-inducing metal;
   forming a metal layer pattern or metal silicide layer pattern in contact with an upper or lower surface of the polycrystalline silicon layer corresponding to a region excluding a channel region in the polycrystalline silicon layer;
   forming a gate electrode corresponding to the channel region of the polycrystalline silicon layer;
   forming a gate insulating layer between the gate electrode and the polycrystalline silicon layer to insulate the polycrystalline silicon layer from the gate electrode;
   forming source and drain electrodes electrically connected to source and drain regions of the polycrystalline silicon layer; and
   after forming the metal layer pattern or metal silicide layer pattern, annealing the substrate to getter the crystallization-inducing metal existing in the channel region of the polycrystalline silicon layer to a region of the polycrystalline silicon layer corresponding to the metal layer pattern or metal silicide layer pattern.

17. The method according to claim 16, further comprising:
after annealing the substrate to getter the crystallization-inducing metal existing in the channel region of the polycrystalline silicon layer, removing the metal layer pattern or metal silicide layer pattern.

18. The method according to claim 16, wherein the metal layer pattern or metal silicide layer pattern includes a metal or metal silicide having a smaller diffusion coefficient in the polycrystalline silicon layer than that of the crystallization-inducing metal or an alloy thereof.

19. The method according to claim 18, wherein the metal or metal silicide of the metal layer pattern or metal silicide layer pattern has a diffusion coefficient of $1/100$ or less of that of the crystallization-inducing metal.

20. The method according to claim 19, wherein the crystallization-inducing metal comprises nickel, and the diffusion coefficient of the metal or metal silicide of the metal layer pattern or metal silicide layer pattern is more than 0 to $10^{-7}$ cm$^2$/s or less.

21. The method according to claim 19, wherein the metal layer pattern or metal silicide layer pattern comprises one selected from the group consisting of Sc, Ti, Zr, Hf, V, Nb, Ta, Cr, Mo, W, Mn, Re, Ru, Os, Co, Rh, Ir, Pt, Y, La, Ce, Pr, Nd, Dy, Ho, TiN, TaN and an alloy or silicide thereof.

22. The method according to claim 16, wherein the annealing is performed for 10 seconds to 10 hours at a temperature of 500 to 993° C.

23. The method according to claim 16, wherein the crystallizing of the amorphous silicon layer is performed by an MIC, MILC or SGS technique.

24. The method according to claim 16, further comprising:
implanting an n-type impurity or a p-type impurity into the region of the polycrystalline silicon layer corresponding to the metal layer pattern or metal silicide layer pattern, or forming a damage region in the region of the polycrystalline silicon layer corresponding to the metal layer pattern or metal silicide layer pattern using ions or plasma.

* * * * *